(12) United States Patent
Silha et al.

(10) Patent No.: US 11,540,429 B2
(45) Date of Patent: Dec. 27, 2022

(54) BATTERY CHARGER

(71) Applicant: MILWAUKEE ELECTRIC TOOL CORPORATION, Brookfield, WI (US)

(72) Inventors: Wyatt R. Silha, Milwaukee, WI (US); Donald J. Truettner, Waukesha, WI (US); John G. Marx, Hartford, WI (US); Cameron R. Schulz, Milwaukee, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 447 days.

(21) Appl. No.: 16/524,438

(22) Filed: Jul. 29, 2019

(65) Prior Publication Data

US 2020/0037474 A1    Jan. 30, 2020

Related U.S. Application Data

(60) Provisional application No. 62/711,926, filed on Jul. 30, 2018.

(51) Int. Cl.
*H02J 7/00* (2006.01)
*H05K 7/20* (2006.01)

(52) U.S. Cl.
CPC ........ *H05K 7/20945* (2013.01); *H02J 7/0021* (2013.01); *H02J 7/0045* (2013.01); *H05K 7/20909* (2013.01)

(58) Field of Classification Search
USPC .......................... 320/109, 110, 111, 112, 113
See application file for complete search history.

(56) References Cited

U.S. PATENT DOCUMENTS

| | | |
|---|---|---|
| 5,297,025 A | 3/1994 | Shoquist et al. |
| 5,647,450 A | 7/1997 | Ogawa et al. |
| 6,027,535 A | 2/2000 | Eberle et al. |

(Continued)

FOREIGN PATENT DOCUMENTS

| | | | | |
|---|---|---|---|---|
| CA | 1340662 C | * | 7/1999 | |
| CA | 2661165 A1 | * | 1/2008 | ............. F21S 6/001 |

(Continued)

OTHER PUBLICATIONS

International Search Report and Written Opinion for Application No. PCT/US2019/043845 dated Nov. 18, 2019 (14 pages).

(Continued)

*Primary Examiner* — Brian Ngo
(74) *Attorney, Agent, or Firm* — Michael Best & Friedrich LLP

(57) ABSTRACT

A battery charger includes a housing having support structure for simultaneously supporting at least two batteries of different types for charging including a first battery of a first type and a second batter of a second type. The battery charger further includes charger electronics supported by the housing and operable to output charging current to charge the first battery and charging current to charge the second battery. A fan is operable to cause air flow through the housing. A fan speed of the fan is adjustable based on a temperature of the battery charger (i) while at least one of the at least two batteries is coupled to the battery charger for charging and (ii) while no batteries are coupled to the battery charger for charging.

23 Claims, 15 Drawing Sheets

(56) References Cited

U.S. PATENT DOCUMENTS

| | | | |
|---|---|---|---|
| 6,081,423 A | 6/2000 | Griffin | |
| 6,188,202 B1 | 2/2001 | Yagi et al. | |
| 6,204,639 B1 | 3/2001 | Takano et al. | |
| 6,215,281 B1 | 4/2001 | Koch | |
| 6,373,228 B1 | 4/2002 | Sakakibara | |
| 6,566,005 B1 | 5/2003 | Shimma et al. | |
| 6,597,572 B2 | 7/2003 | Nishikawa et al. | |
| 6,636,016 B2 | 10/2003 | Tanaka et al. | |
| 6,949,914 B2 | 9/2005 | Aradachi et al. | |
| 6,967,464 B2 | 11/2005 | Heigl et al. | |
| 7,116,554 B2 | 10/2006 | Lee et al. | |
| 7,241,530 B2 | 7/2007 | Oogami | |
| 7,326,490 B2 | 2/2008 | Moores, Jr. et al. | |
| 7,355,851 B2 | 4/2008 | Lanni | |
| 7,495,415 B2 | 2/2009 | Kanouda et al. | |
| 7,504,804 B2 | 3/2009 | Johnson et al. | |
| 7,557,542 B2 | 7/2009 | Bushong et al. | |
| 7,692,408 B2 | 4/2010 | Miyazaki et al. | |
| 7,733,054 B2 | 6/2010 | Phillips et al. | |
| 7,800,901 B2 | 9/2010 | Borowy et al. | |
| 7,843,691 B2 | 11/2010 | Reichert et al. | |
| 7,846,577 B2 | 12/2010 | Kozu et al. | |
| RE42,468 E | 6/2011 | Heigl et al. | |
| 7,956,575 B2 | 6/2011 | Kawano et al. | |
| 7,974,090 B2 | 7/2011 | Risher-Kelly | |
| 8,203,307 B2 | 6/2012 | Zick et al. | |
| 8,803,477 B2 | 8/2014 | Kittrell | |
| 8,841,884 B2 | 9/2014 | Bourbeau et al. | |
| 9,225,184 B2 | 12/2015 | Rief | |
| 9,252,621 B2 | 2/2016 | Miyano | |
| 9,306,251 B2 | 4/2016 | Inoue | |
| 9,608,461 B2 | 3/2017 | Chen et al. | |
| 9,620,827 B2 | 4/2017 | Houchin-Miller et al. | |
| 9,634,503 B2 | 4/2017 | Taga et al. | |
| 9,692,091 B2 | 6/2017 | Yamomoto et al. | |
| 9,728,822 B2 | 8/2017 | Taga | |
| 9,742,043 B2 | 8/2017 | Tanigaki et al. | |
| 9,847,562 B2 | 12/2017 | Kondo | |
| 9,917,452 B2 | 3/2018 | Kishima et al. | |
| 10,090,498 B2 | 10/2018 | Olsson et al. | |
| 10,103,558 B2 | 10/2018 | Teng et al. | |
| 2006/0266510 A1 | 11/2006 | Nobashi | |
| 2007/0017230 A1 | 1/2007 | Pan | |
| 2007/0139004 A1 | 6/2007 | Satsuma | |
| 2007/0139887 A1 | 6/2007 | Lee et al. | |
| 2008/0290836 A1 | 11/2008 | Tsai et al. | |
| 2009/0021913 A1 | 1/2009 | Kuan | |
| 2011/0014501 A1* | 1/2011 | Scheucher | B60K 1/04 429/7 |
| 2011/0121783 A1 | 5/2011 | Boyles et al. | |
| 2011/0279968 A1 | 11/2011 | Lin et al. | |
| 2011/0300420 A1 | 12/2011 | Johnson, Jr. | |
| 2013/0044002 A1 | 2/2013 | Schneider et al. | |
| 2014/0139177 A1 | 5/2014 | Li | |
| 2014/0340025 A1 | 11/2014 | Rief | |
| 2014/0362522 A1 | 12/2014 | Degner et al. | |
| 2014/0375269 A1* | 12/2014 | Ogura | H02J 7/0026 320/112 |
| 2015/0030717 A1 | 1/2015 | Gebert et al. | |
| 2015/0077043 A1 | 3/2015 | Seidel et al. | |
| 2015/0084591 A1 | 3/2015 | Kishima et al. | |
| 2015/0155724 A1 | 6/2015 | Han et al. | |
| 2015/0303717 A1* | 10/2015 | Schneider | H01M 10/441 320/113 |
| 2015/0340745 A1 | 11/2015 | Inoue | |
| 2016/0226111 A1 | 8/2016 | Blume et al. | |
| 2016/0285295 A1 | 9/2016 | Marinov et al. | |
| 2016/0294025 A1 | 10/2016 | Choi et al. | |
| 2016/0294203 A1 | 10/2016 | Teng et al. | |
| 2017/0331302 A1 | 11/2017 | Namiki | |
| 2017/0332517 A1 | 11/2017 | Gu et al. | |
| 2018/0090957 A1 | 3/2018 | Rao | |
| 2018/0130980 A1 | 5/2018 | Ogura et al. | |
| 2018/0191183 A1 | 7/2018 | Namiki | |
| 2018/0376625 A1 | 12/2018 | Truettner et al. | |
| 2019/0027949 A1 | 1/2019 | Critelli | |
| 2019/0075665 A1 | 3/2019 | Choski et al. | |
| 2020/0128672 A1 | 4/2020 | Silha et al. | |

FOREIGN PATENT DOCUMENTS

| | | | |
|---|---|---|---|
| CN | 205178582 U | 4/2016 | |
| CN | 205693381 U | 11/2016 | |
| CN | 206041584 U | 3/2017 | |
| CN | 106941271 A | 7/2017 | |
| DE | 102007042399 A1 | 3/2009 | |
| EP | 3332475 A2 | 9/1989 | |
| EP | 2221939 A2 | 8/2010 | |
| EP | 1580863 B1 | 11/2016 | |
| EP | 3229337 A1 | 10/2017 | |
| EP | 3379688 A1 | 9/2018 | |
| GB | 2449444 A | 11/2008 | |
| JP | 2006330913 A | 12/2006 | |
| JP | 2014038935 A | 2/2014 | |
| JP | 5620771 B2 | 11/2014 | |
| JP | 2012074161 A | 11/2014 | |
| WO | WO 2005117231 A1 | 12/2005 | |
| WO | WO 2009033865 A1 | 3/2009 | |
| WO | WO 2013027599 A1 | 2/2013 | |
| WO | WO 2015075914 A1 | 5/2015 | |
| WO | WO 2017002519 A1 | 1/2017 | |
| WO | 2017083405 A1 | 5/2017 | |
| WO | WO 2017208710 A1 | 12/2017 | |

OTHER PUBLICATIONS

International Search Report and Written Opinion for Application No. PCT/US2019/056690 dated Feb. 7, 2020 (10 pages).

Cho et al., Transient Modeling and Validation of Lithium Ion Battery Pack with Air Cooled Thermal Management System for Electric Vehicles, International Journal of Automotive Techology. Aug. 2014. vol. 15, Issue 5, pp. 795-803.

Park et al., Battery Cell Arrangement and Heat Transfer Fluid Effects on the Parasitic Power Consumption and the Cell Temperature Distribution in a Hybrid Electric Vehicle, Journal of Power Sources, 2013, pp. 191-198.

Power, High Current OEM Battery Charger Delivers 25 A Output, Dec. 10, 2014, https://news.thomasnet.com/fullstoryhigh-current-oem-battery-charger-delivers-25-a-output-20037078.

Tools in Action, DeWALT Portable Power Station & 60v and 20V Charger Charger DCB1800—First Look, Jun. 29, 2016; https://www.youtube.com/watch?v=mPE32YCwJJA, accessed Sep. 30, 2019.

Workshopaddict, DeWALT Portable Power Station & Charger—DCB1800, Jun. 23, 2016; https://www.youtube.com/watch?v=8w-uMmkJ2KE, accessed Sep. 30, 2019.

A Concord Carpenter / ToolBoxBuzz, DeWALT 1800 Watt Portable Power Station DCB1800, Jun. 25, 2016; https://www.youtube.com/watch?v=-GiL2vmCB6g, accessed Sep. 30, 2019.

DeWALT 1800 Portable Power Station and Charger Documentation, tool was publicly available as early as Jul. 30, 2018 (37 pages).

Examination Report No. 2 issued by the Australian Government for Application No. 2019314293 dated Mar. 29, 2022 (3 pages).

Examination Report No. 1 issued by the Australian Government for Application No. 2019314293 dated Dec. 22, 2021 (3 pages).

Extended European Search Report for Application No. 19844766.6 dated Feb. 16, 2022 (7 pages).

* cited by examiner

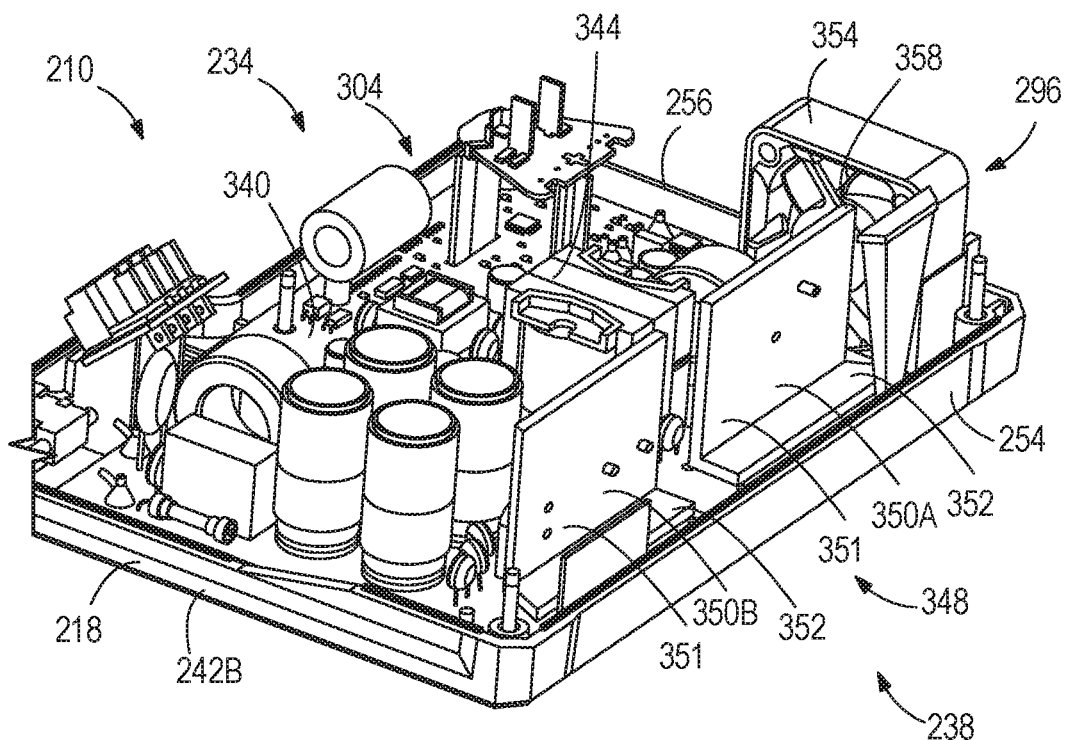
FIG. 11
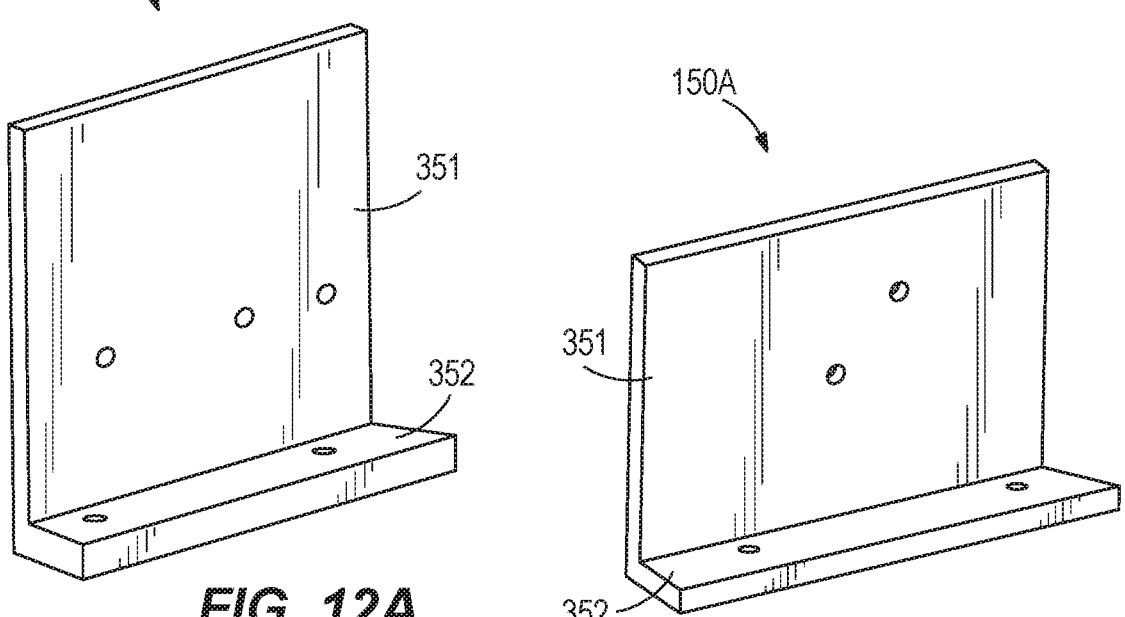
FIG. 12A
FIG. 12B

BATTERY CHARGER

CROSS-REFERENCE TO RELATED APPLICATIONS

This application claims priority to U.S. Provisional Patent Application No. 62/711,926 filed on Jul. 30, 2018, the entire contents of which are incorporated herein by reference.

FIELD

The present disclosure relates to battery chargers and, more particularly, to cooling a battery charger.

SUMMARY

In one independent embodiment, a battery charger includes a housing having support structure for simultaneously supporting at least two batteries of different types for charging including a first battery of a first type and a second battery of a second type. The support structure defines a channel configured to receive a projection of the first battery. At least a portion of the support structure includes a plastic material molded to define the channel, and a metal material molded in the plastic material. The battery charger further includes charger electronics supported by the housing and operable to output charging current to charge the first battery and charging current to charge the second battery. A fan is operable to cause air flow through the housing. A fan speed of the fan is adjustable based on a temperature of the battery charger (i) while at least one of the at least two batteries is coupled to the battery charger for charging and (ii) while no batteries are coupled to the battery charger for charging. An indicator is positioned on the housing and operable to indicate an operation of the battery charger. The indicator includes a light pipe for illuminating the indicator.

In another independent embodiment, a battery charger includes a housing having support structure for simultaneously supporting at least two batteries of different types for charging including a first battery of a first type and a second battery of a second type. The battery charger further includes charger electronics supported by the housing and operable to output charging current to charge the first battery and charging current to charge the second battery. A fan is operable to cause air flow through the housing. A fan speed of the fan is adjustable based on a temperature of the battery charger (i) while at least one of the at least two batteries is coupled to the battery charger for charging and (ii) while no batteries are coupled to the battery charger for charging. An indicator is positioned on the housing and operable to indicate an operation of the battery charger. The indicator includes a light pipe for illuminating the indicator.

In yet another independent embodiment, a battery charger includes a housing having support structure for simultaneously supporting at least two batteries of different types for charging including a first battery of a first type and a second battery of a second type. The battery charger further includes charger electronics supported by the housing and operable to output charging current to charge the first battery and charging current to charge the second battery. A fan is operable to cause air flow through the housing. A fan speed of the fan is adjustable based on a temperature of the battery charger (i) while at least one of the at least two batteries is coupled to the battery charger for charging and (ii) while no batteries are coupled to the battery charger for charging.

In yet still another independent embodiment, a battery charger may generally include a housing defining an air inlet and an air outlet; charger electronics positioned within the housing; a tubular heat sink operable to dissipate heat in the charger; a fan operable to cause air flow from the inlet to the outlet and along the heat sink; and a diverter integral with and extending within the housing, the diverter being configured to facilitate the air flow from the air inlet to the air outlet.

The diverter may be configured to create turbulent air flow within the housing. In some constructions, the diverter extends from a top of the housing. The housing may include a diverter extending from a bottom of the housing, the diverter being configured to direct air along a bottom of and/or through the charger electronics. The fan may be between an end of the heat sink and the air outlet. A baffle may be connected between the end of the heat sink and the fan.

In a further independent embodiment, a battery charger may generally include a housing defining an air inlet positioned on a first side of the housing and an air outlet positioned on an opposite second side of the housing; charger electronics positioned within the housing; a tubular heat sink operable to dissipate heat in the charger; and a fan operable to cause air flow from the inlet to the outlet and along the heat sink.

In some constructions, the first side may be a front of the housing, and the second side may be a back of the housing such that the second side may be opposite the first side. The first side may be a front of the housing, and the second side may be adjacent and oriented about 90 degrees relative to the first side. The air inlet may be positioned proximate a battery couplable to the charger; however, air flow may not enter or exit the battery before or after flowing through the housing of the charger.

The battery charger may further include a second air inlet positioned on a third side of the housing. The third air inlet may be configured to direct air flow along a bottom of the charger electronics. The charger electronics may include a second heat sink for dissipating heat from components of the charger electronics to the bottom of the charger electronics. The tubular heat sink may include a slot for directing the air flow from the heat sink over a component of the charger electronics.

In yet another independent embodiment, a battery charger may generally include a housing having support structure for supporting at least two different types of batteries for charging; charger electronics operable to output a charging current to charge a supported battery; and a fan operable to cause air flow through the housing. A fan speed may be adjusted based on a temperature of the charger regardless if one of the batteries is coupled to the charger.

In yet still another independent embodiment, a battery charger may generally include a housing having support structure for supporting different types of batteries for charging; charger electronics operable to output a charging current to charge a supported battery; and an indicator positioned on the housing and operable to indicate an operation of the charger, the indicator including a light pipe for illuminating the indicator.

In a further independent embodiment, a battery charger may generally include a housing including a support portion connectable to and operable to support a battery pack, the support portion defining a channel operable to receive a projection on the battery pack, the support portion including a plastic material molded to define the channel, and a metal material molded in the plastic material; a charging circuit supported by the housing; and a charger terminal electrically connected to the charging circuit and connectable to a terminal of the battery pack.

Other independent aspects of the disclosure will become apparent by consideration of the detailed description and accompanying drawings.

BRIEF DESCRIPTION OF THE DRAWINGS

FIG. 11 is a perspective view of another alternative construction of a battery charger, with portions of the housing removed, and illustrating a second embodiment of a heat sink assembly.

FIG. 12A is a perspective of a first heat sink of the heat sink assembly of FIG. 11.

FIG. 12B is a perspective view of a second heat sink of the heat sink assembly of FIG. 11.

DETAILED DESCRIPTION

Figure 1:
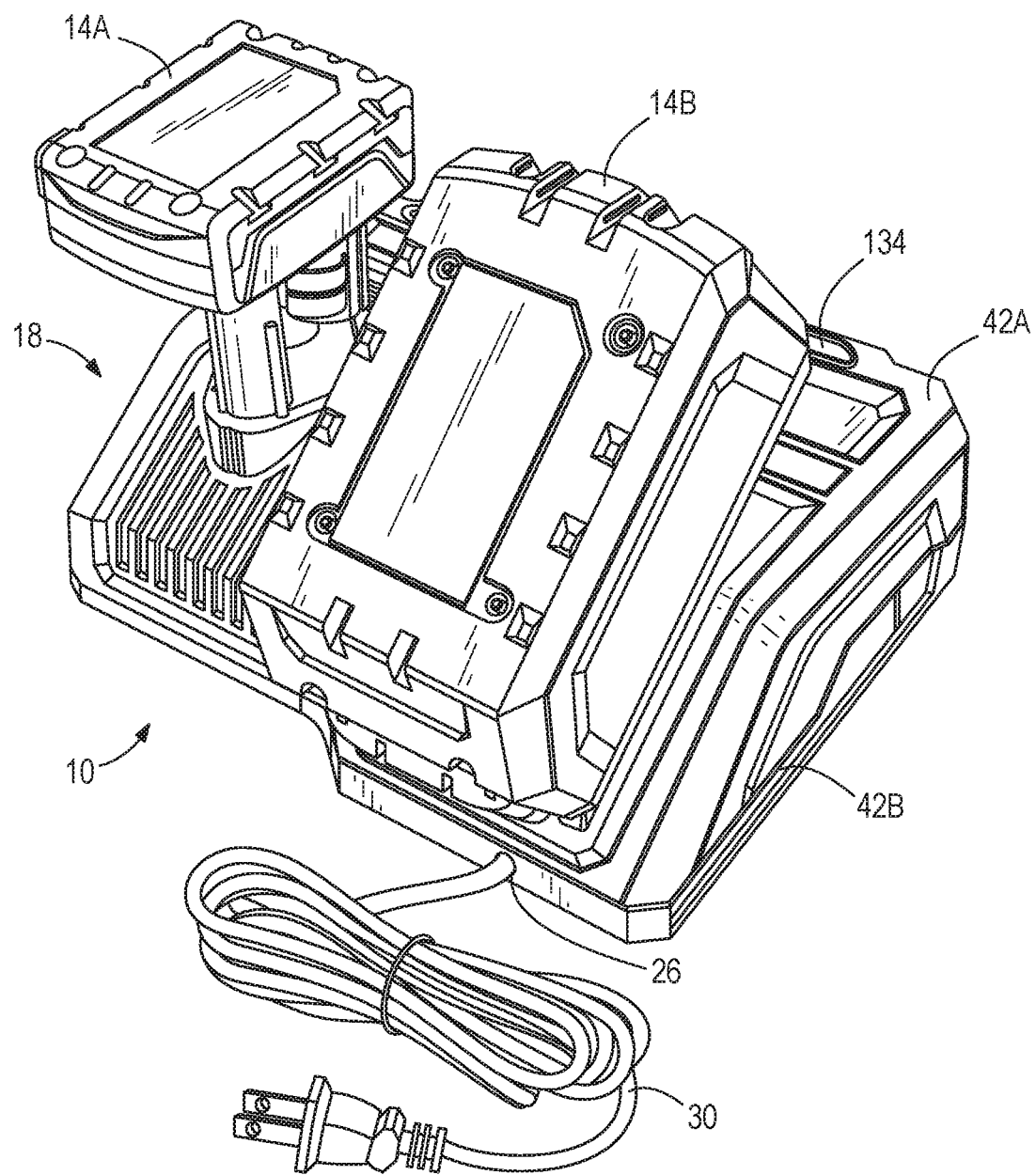
FIG. 1 is a perspective view of a battery charger supporting different types of batteries for charging.

Before any independent embodiments of the disclosure are explained in detail, it is to be understood that the disclosure is not limited in its application to the details of construction and the arrangement of components set forth in the following description or illustrated in the following drawings. The disclosure is capable of other independent embodiments and of being practiced or of being carried out in various ways.

Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof.

Relative terminology, such as, for example, "about", "approximately", "substantially", etc., used in connection with a quantity or condition would be understood by those of ordinary skill to be inclusive of the stated value and has the meaning dictated by the context (for example, the term includes at least the degree of error associated with the measurement of, tolerances (e.g., manufacturing, assembly, use, etc.) associated with the particular value, etc.). Such terminology should also be considered as disclosing the range defined by the absolute values of the two endpoints. For example, the expression "from about 2 to about 4" also discloses the range "from 2 to 4." The relative terminology may refer to plus or minus a percentage (e.g., 1%, 5%, 10% or more) of an indicated value.

Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not listed.

Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used in the present application, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

Many of the modules and logical structures described are capable of being implemented in software executed by a microprocessor or a similar device or of being implemented in hardware using a variety of components including, for example, application specific integrated circuits ("ASICs"). Terms like "controller" and "module" may include or refer to both hardware and/or software. Capitalized terms conform to common practices and help correlate the description with the coding examples, equations, and/or drawings. However, no specific meaning is implied or should be inferred simply due to the use of capitalization. Thus, the claims should not be limited to the specific examples or terminology or to any specific hardware or software implementation or combination of software or hardware.

FIG. 1 illustrates a battery charger 10 operable to charge a battery 14A, 14B coupled to the charger 10. In the illustrated construction, the battery charger 10 is operable to charge a first battery 14A of a first type and a second battery 14B of a second type. The illustrated battery charger 10 may be operable to charge a high output battery (e.g., having a current capacity of 12 amp-hours (Ah) or more), which requires about 3 times the power of typical chargers, in about 60 minutes.

The battery type may be defined by nominal voltage, current capacity, connection configuration (e.g., "tower" vs. "slide-on", or two different slide-on interfaces), etc., of the battery 14A, 14B. For example, the first battery 14A may include a high-power battery pack with a nominal voltage of about 12 volts (V) and having a tower-style configuration, and the second battery 14A may include a high-power battery pack with a nominal voltage of 18V and a slide-on configuration. In other constructions (not shown), the batteries 14A, 14B may be the same type of battery.

Each battery 14A, 14B is connectable to and operable to power various motorized power tools (e.g., a cut-off saw, a miter saw, a table saw, a core drill, an auger, a breaker, a demolition hammer, a compactor, a vibrator, a compressor, a drain cleaner, a welder, a cable tugger, a pump, etc.), outdoor tools (e.g., a chain saw, a string trimmer, a hedge trimmer, a blower, a lawn mower, etc.), other motorized devices (e.g., vehicles, utility carts, a material handling cart, etc.), and non-motorized electrical devices (e.g., a power supply, a light, an AC/DC adapter, a generator, etc.).

Figure 2:
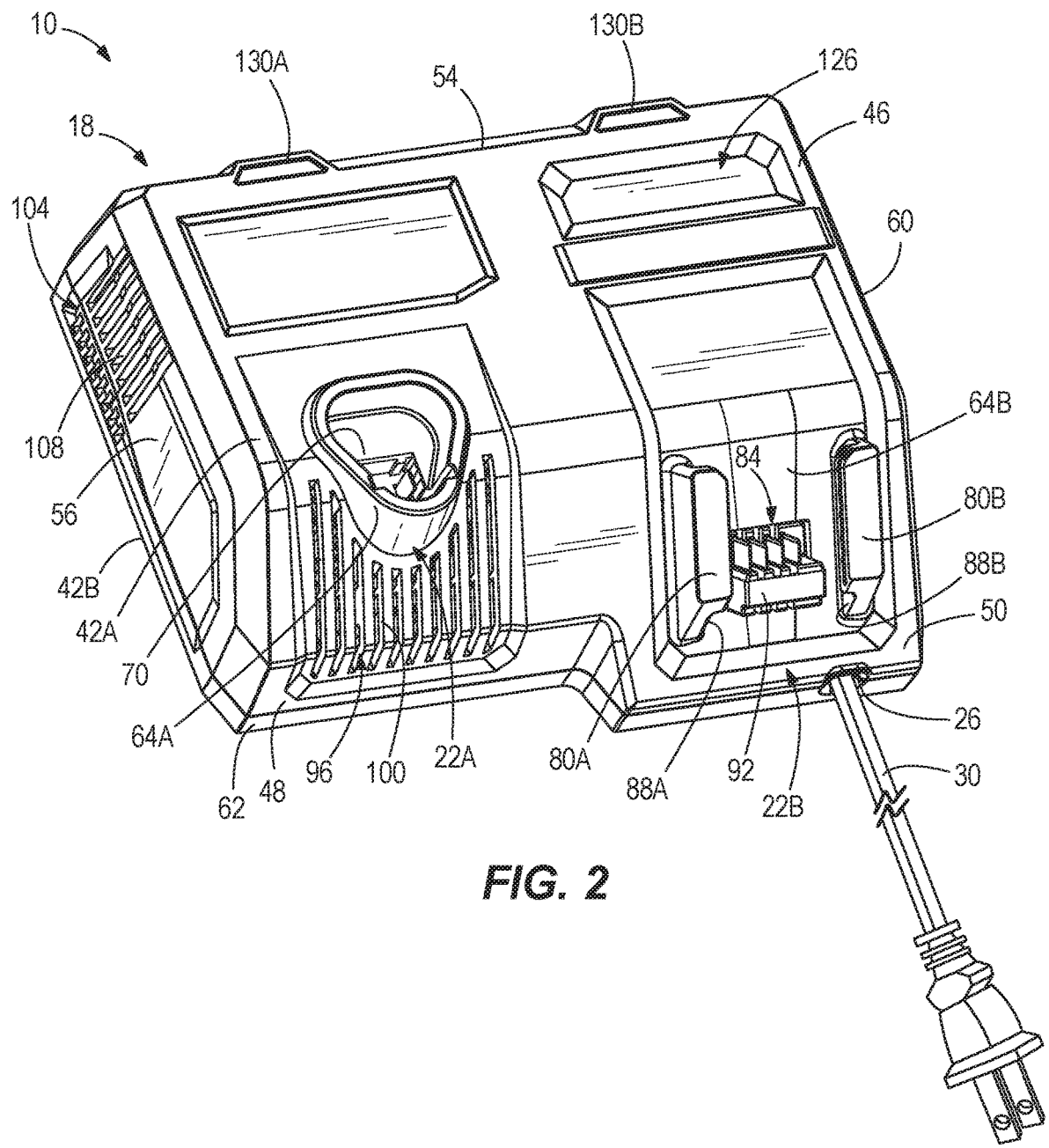
FIG. 2 is a perspective view of an alternative construction of a battery charger for charging different types of batteries.
Figure 9:
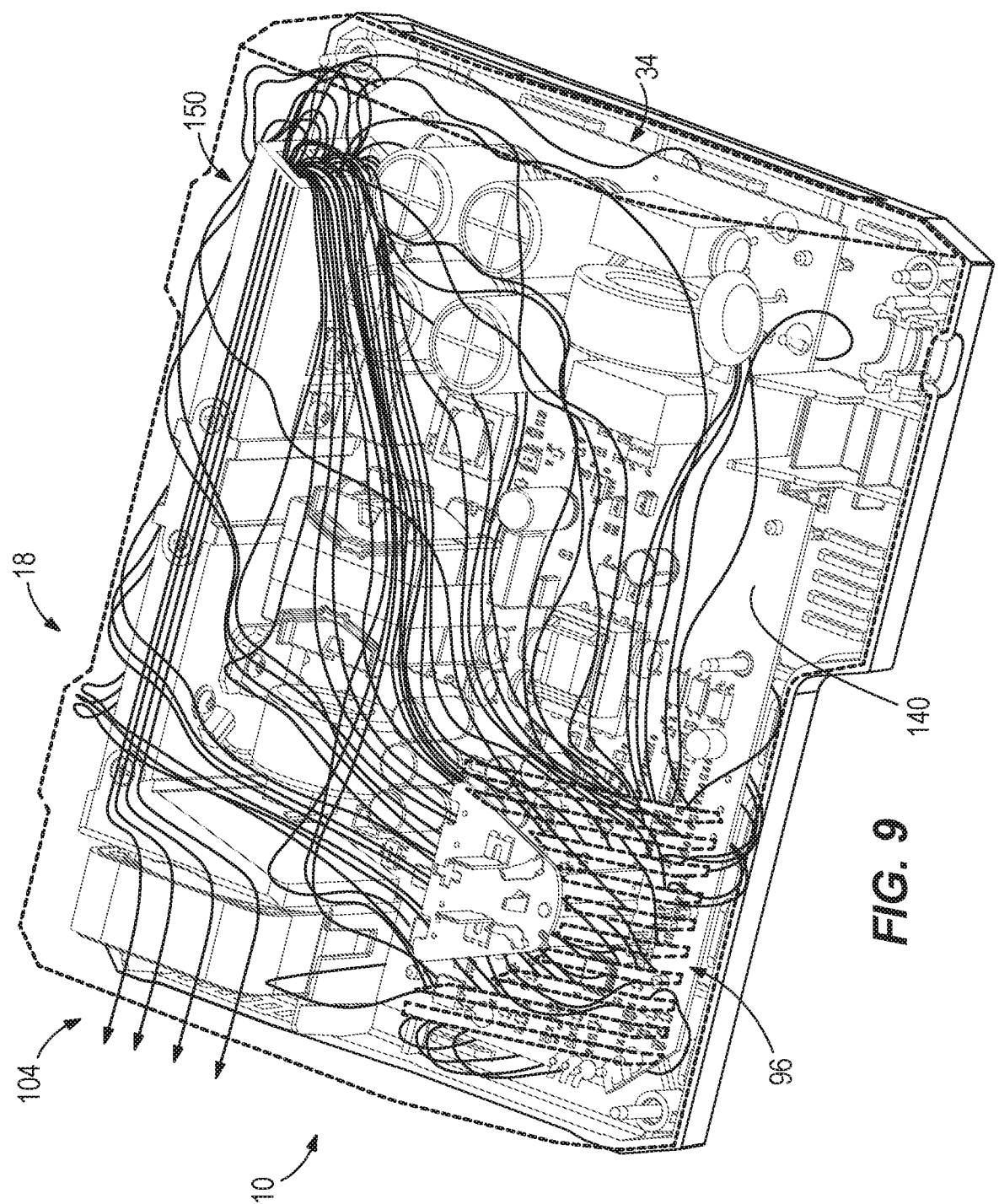
FIG. 9 is a top perspective view of the battery charger of FIG. 2, with portions of a housing shown as transparent and illustrating an airflow pattern through the housing.

With reference to FIG. 2, in one embodiment, the charger 10 includes a housing 18 providing support structure 22A, 22B (FIG. 2) engageable with the respective batteries 14A, 14B, a power input port 26 for connection to a power supply (e.g., through a power cord 30), charger electronics 34 (FIG. 6), and a heat dissipating structure 38. Air flow (e.g., curvilinear lines; FIG. 9) is configured to flow though the housing 18 for dissipating heat generated by the charger 10.

With continued reference to FIG. 2, the charger housing 18 has a top portion 42A and an opposite bottom portion 42B coupled to the top portion 42A (e.g., by fasteners (not shown)). The housing portions 42A, 42B may be formed of plastic with each molded as a single piece.

The top portion 42A has a top wall 46, a lower wall 48, and an inclined wall 50 coupled between the walls 46, 48. The top wall 46 is spaced from a bottom surface 51 (FIG. 4) of the bottom portion 42B, and the lower wall 48 is substantially perpendicular to the bottom surface of the bottom portion 42B. The top wall 46 provides a top of the housing 18, and the bottom portion 42B (i.e., bottom surface 51) provides a bottom of the housing 18 opposite the top. The inclined wall 50 and the lower wall 48 provide a front of the housing 18. The top portion 42A further includes a back wall 54 (FIG. 5) opposite the front and opposite side walls 56, 60 of the top portion 42A. The bottom portion 42B has a raised wall 62 interfacing with one or more walls (e.g., the back wall 54, the side walls 56, 60, etc.) of the portion 42A.

The housing 18 provides the battery support structure 22A, 22B (FIG. 2). Each support structure 22A, 22B is at least partially positioned substantially on the front of the housing (e.g., on the inclined wall 50) and defines adjacent supporting sections 64A, 64B. The supporting sections 64A, 64B are configured to support the batteries 14A, 14B, respectively. In the illustrated embodiments, the battery charger 10 includes two supporting sections 64A, 64B. In other embodiments, the battery charger 10 may include one or more supporting sections for supporting one or more batteries of the same or different type, or a combination thereof.

The illustrated supporting section 64A defines a recess 70, as a battery receiving port, defined by the top wall 46 and the inclined wall 50. The recess 70 is configured to receive at least a portion (e.g., the tower) of the battery 14A. A first set of charger terminals 74 (FIG. 6) extend from within the housing 18 through holes into the recess 70. The charger terminals 74 are configured to electrically connect to battery terminals of the battery 14A received in the recess 70 for charging.

With continued reference to FIG. 2, the illustrated supporting section 64B includes rail members 80A, 80B and a charger terminal block 84. The rail members 80A. 80B are spaced apart, substantially parallel and positioned on the inclined wall 50. A groove or channel 88A, 88B is defined between the inclined wall 50 and the associated rail member 80A, 80B. The rail members 80A, 80B are engageable with corresponding structure on the battery 14B. More specifically, each channel 88A, 88B is configured to receive a portion (i.e., projection) of the battery 14B. The charger terminal block 84 is positioned between the rail members 80A, 80B and includes a second set of charger terminals 92 configured to electrically connect to battery terminals of the battery 14B for charging when the battery 14B (or portions thereof) is received in the channels 88A, 88B.

Figure 10A:
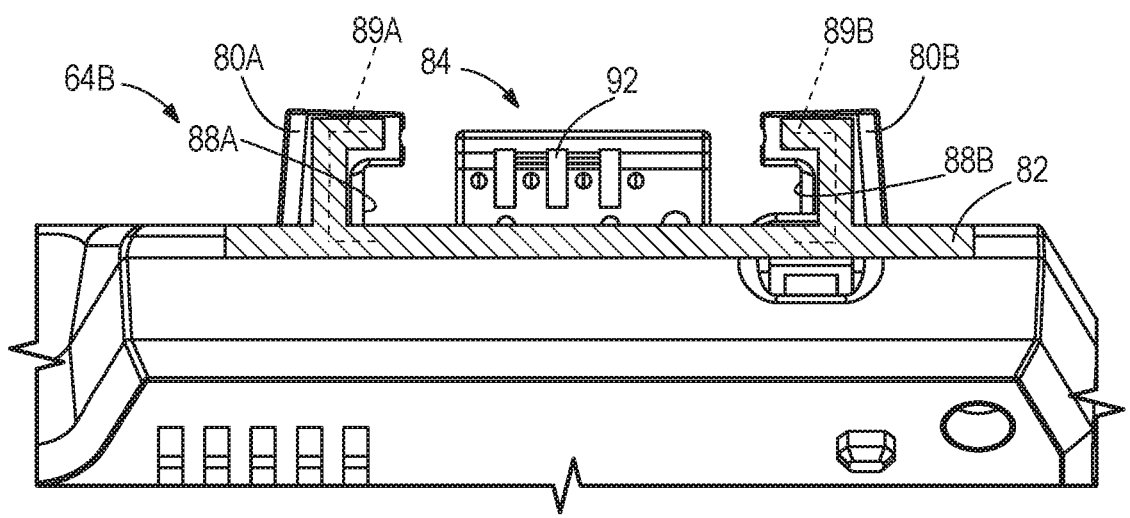
FIG. 10A is a cross-sectional view of a battery supporting portion of the battery charger of FIG. 2.
Figure 10B:
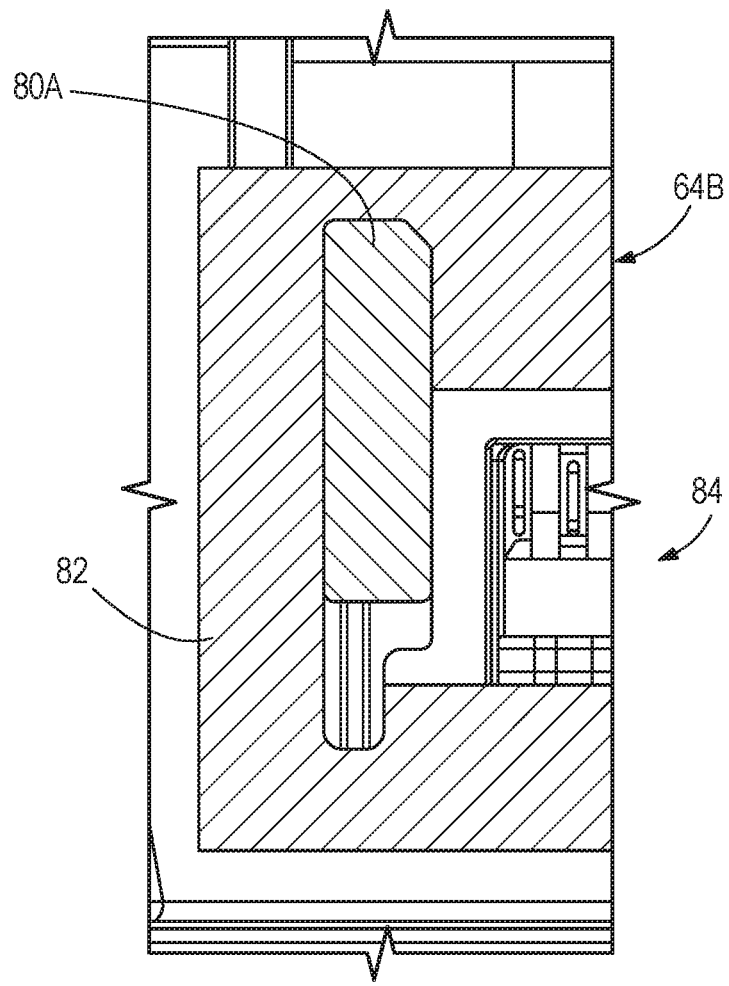
FIG. 10B is an enlarged top view of a portion of the battery supporting portion of the battery charger shown in FIG. 10A.

In some embodiments, as illustrated in FIGS. 10A-10B, the rail members 80A. 80B include a reinforcement member 82. The illustrated reinforcement member 82 is molded as a part of the housing 18 with the rail members 80A. 80B and with the supporting section 64B. The illustrated reinforcement member 82 is formed as a single piece of reinforcing material, such as metal (e.g., a metal stamping), hard plastic, etc. For example, in one embodiment, the rail members 80A, 80B are formed by a metal material molded in a plastic material in which the metal material forms the reinforcement member 82. The illustrated metal material defines a C-shaped portion 89A,B around each respective channel 88A. 88B (i.e., at a cross-section of the supporting section 64B). In other embodiments (not shown), the reinforcement member 82 is formed by two or more pieces coupled together, in which at least one of the pieces has the C-shaped portion around the respective channel 88A, 88B. In some embodiments, the reinforcement member 82 includes two L-shaped portions (i.e., at a cross-section of the supporting section 64B), and does not include the 90-degree bend found at the end of the C-shaped portions illustrated in FIG. 10A. In other words, with reference to the view of FIG. 10A, the horizontal leg of the L-shape extends along the housing 18 (left-right direction, in FIG. 10A) and the vertical leg of the L-shape extends away from the housing 18 (upward, in FIG. 10A). In some embodiments of charger 10 with the L-shaped reinforcement members 82, the plastic portion of the rails 80A, 80B are similarly L-shaped without the 90-degree bend shown in FIG. 10A. Additionally, in some embodiments of the charger having L-shaped rails 80A, 80B, the vertical legs of the rails 80A, 80B oppose one another to form a channel on top of the housing 18, where the vertical legs of the rails 80A, 80B are configured to abut a battery pack (e.g., the battery pack 14B), or a portion thereof, inserted into the channel.

Figure 3:
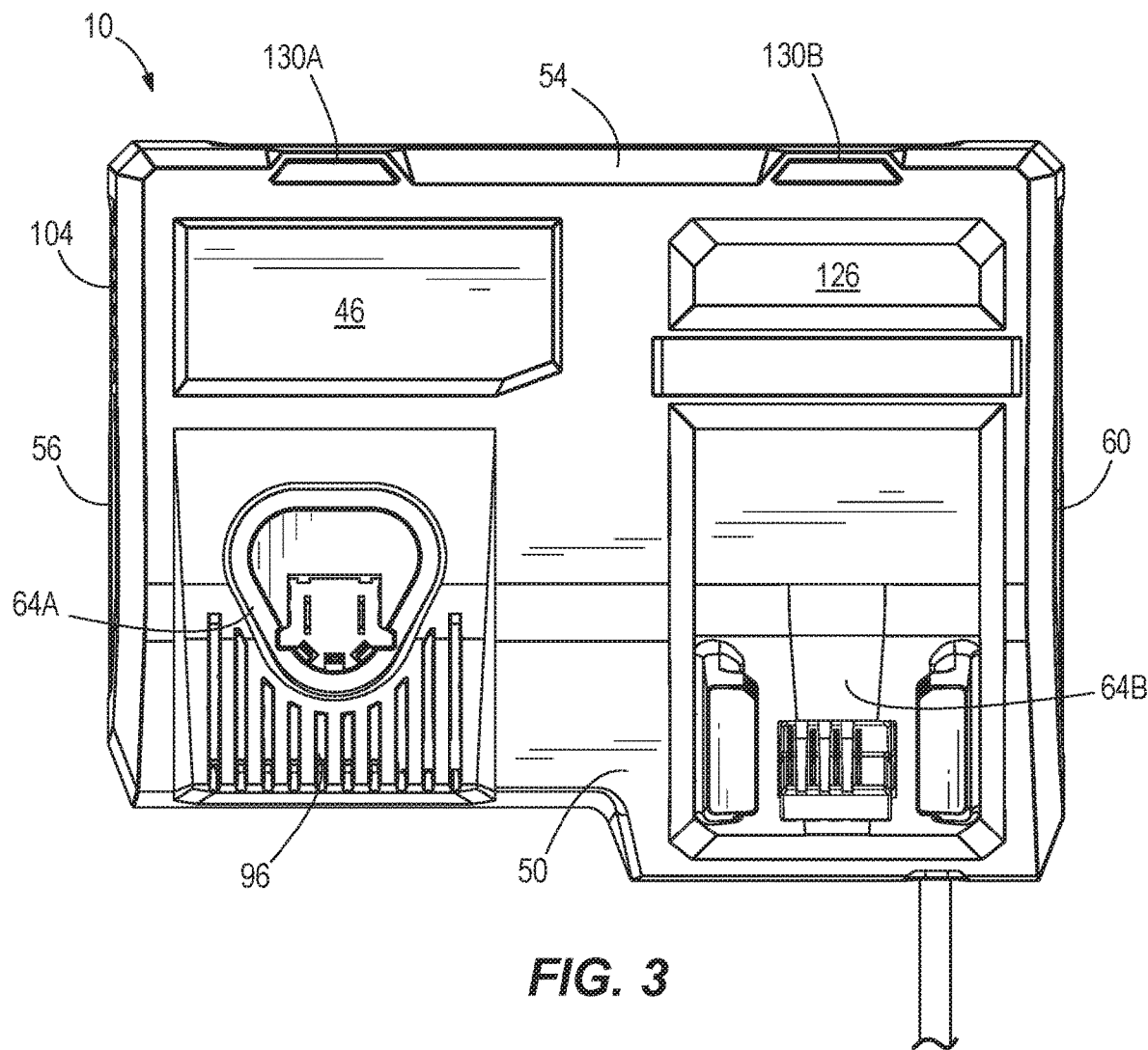
FIG. 3 is a top view of the battery charger of FIG. 2.
Figure 4:
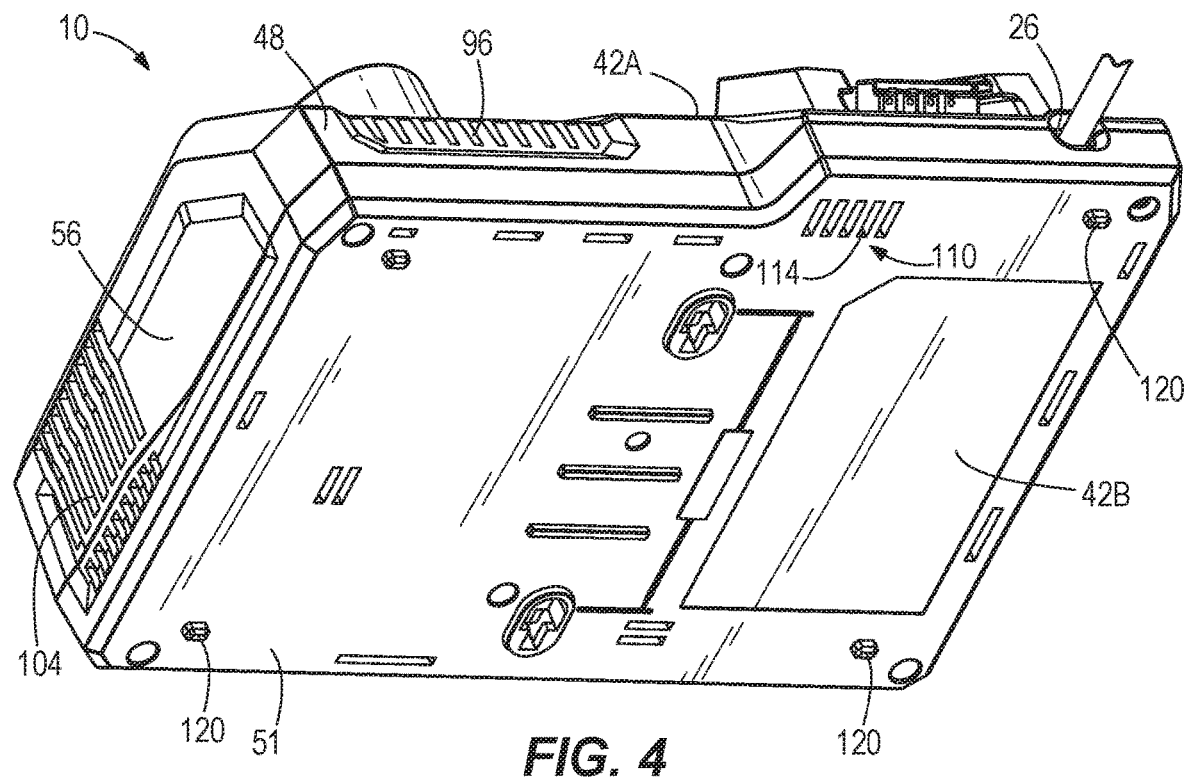
FIG. 4 is a bottom perspective of the battery charger of FIG. 2.

With reference to FIGS. 2-4, the housing 18 defines an air inlet 96 in the inclined wall 50 and positioned below the first supporting section 64A (e.g., the recess 70). As such, the illustrated air inlet 96 is below the battery 14A when coupled to the charger 10. In addition, the illustrated inlet 96 is positioned on the front of the housing 18 and includes longitudinal slots 100 defined in the inclined wall 50 and, partially, by the lower wall 48. The illustrated slots 100 extend through the inclined wall 50 into an interior of the housing 18. The slots 100 extend from proximate the top wall 46 to the lower wall 48. The slots 100 are configured to facilitate air flow into the housing 18.

The housing 18 also defines an air outlet 104 positioned on the side 56 of the housing 18 and proximate the back 54. The outlet 104 includes longitudinal slots 108 defined by the side 56 and extending from proximate the bottom portion 42B to proximate the top portion 42A (e.g., the top wall 46). The slots 108 are configured to facilitate air flow exiting the housing 18. The inlet 96 and the outlet 104 are positioned on different locations of the housing 18 (e.g., as illustrated, the outlet 104 is positioned on the side 56 oriented at 90 degrees relative to the front of the housing 18).

The housing 18 may include more than one inlet and/or outlet. For example, as shown in FIG. 4, the housing 18 further defines a second air inlet 110 positioned on the bottom. The illustrated second air inlet 110 is defined by the bottom surface 51 of the bottom portion 42B. The second air inlet 110 includes slots 114 proximate the front (e.g., the lower wall 48) and the side 56 of the housing 18. The second air inlet 110 may facilitate air flow to a bottom side 118 (FIG. 6) of the charger electronics 34, as further discussed below.

It should be understood that, in other constructions (not shown), the first inlet 96, the second inlet 110, and/or the outlet 104 may be positioned on any side of the housing 18 (e.g., the back 54, the other side 60, the bottom, etc.).

The slots 100, 108, 114 may have the same or different lengths. For example, the illustrated slots 100 of the first inlet 96 have different lengths. The illustrated slots 114, 108 of each of the second inlet 110 and the outlet 104, respectively, have the same length. Furthermore, the slots 100, 108, 114 may have any shape, such as, rectangular, triangular, trapezoidal, etc. For example, FIG. 3 illustrates the inlet 96 formed by rectangular and trapezoidal slots, while FIG. 4 illustrates the outlet 104 being formed by generally rectangular slots.

With reference to FIG. 4, feet members 120 extend from and are configured to position the bottom portion 42B of the housing 18 at a distance (e.g., three millimeters (3 mm)) from a work surface (e.g., a table). Furthermore, the feet members 120 are configured to facilitate air flow to the second inlet 110. The illustrated feet members 120 include an elastomeric material and to improve support (e.g., frictional, vibrational, etc.) of the charger 10 on the work surface.

With reference to FIGS. 2-3, the top portion 42A includes an indicia region 126 in which logos, images, brands, text, marks, etc., are displayed. The illustrated indicia region 126 is positioned on the top wall 46 and above the second supporting section 64B. The housing 18 may include one or more indicia regions positioned on any of the sides (e.g., top, bottom, back 54, etc.). Furthermore, the top wall 46 may include another indicia region above the first supporting section 64A.

The top portion 42A includes a plurality of openings 130 (e.g., two openings 130A, 130B) defined by the top wall 46 and positioned proximate the back 54 of the housing 18. One opening 130A is positioned opposite the first supporting section 64A, and the other opening 130B is positioned opposite the second supporting section 64B. The openings 130A, 130B may be configured to receive a lens 134 (only one of which is shown in FIG. 1). A light source (e.g., a light-emitting diode (LED), a light pipe, etc.) may be provided within the housing 18 to illuminate the lens 134. As such, the openings 130A, 130B and the lens 134 are configured to form indicators on the top portion 42A. Each supporting section 64A, 64B has an indicator for indicating an operation (e.g., charging) of the charger 10.

The illustrated power input port 26 is positioned on the front of the housing 18, and below the second supporting section 64B (FIG. 2). More specifically, the power input port 26 is defined in the lower wall 48. In other embodiments (not shown), the power input port 26 may be located on any side (e.g., back 54, bottom, etc. of the housing 18). The illustrated power cord 30 extends from the charger electronics 34 within the housing 18 (FIG. 6) through the power input port 26 to the power source.

Figure 6:
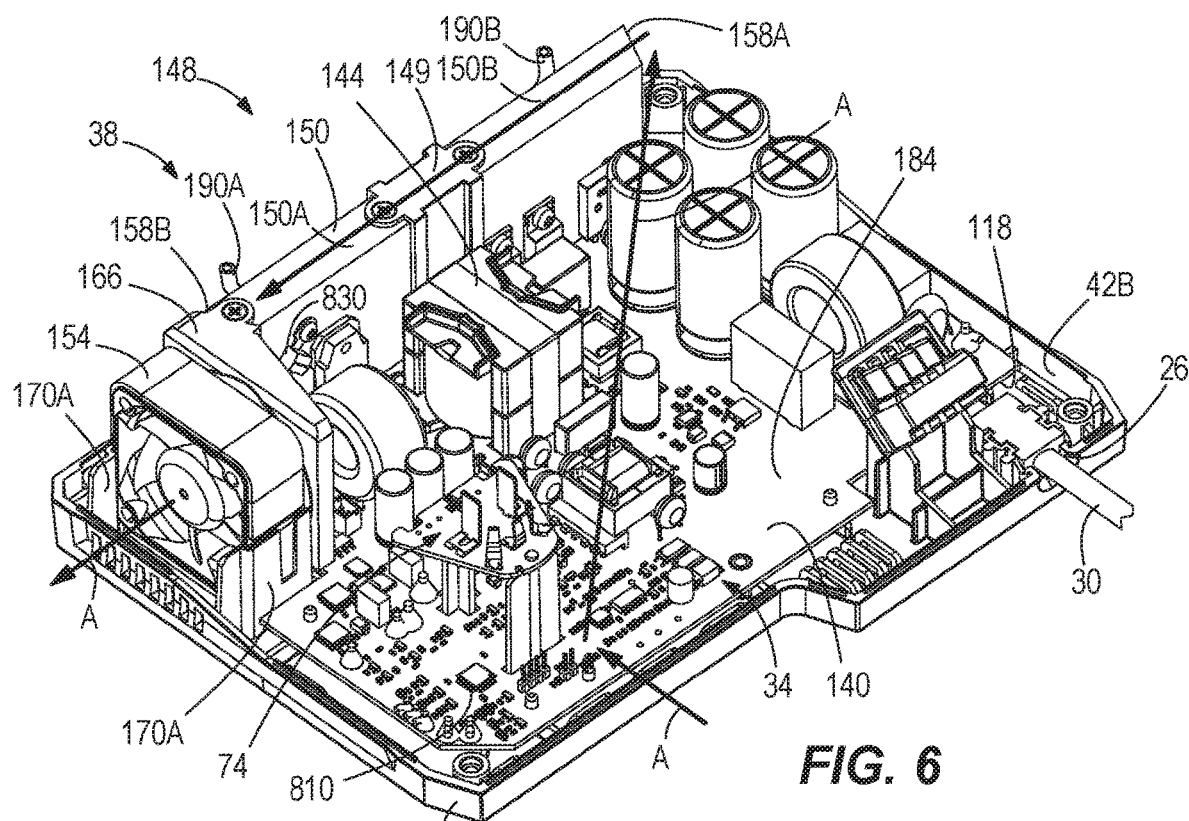
FIG. 6 is a top perspective view of the battery charger of FIG. 2, with portions of the housing removed, and illustrating a first embodiment of a heat sink assembly.
Figure 7:
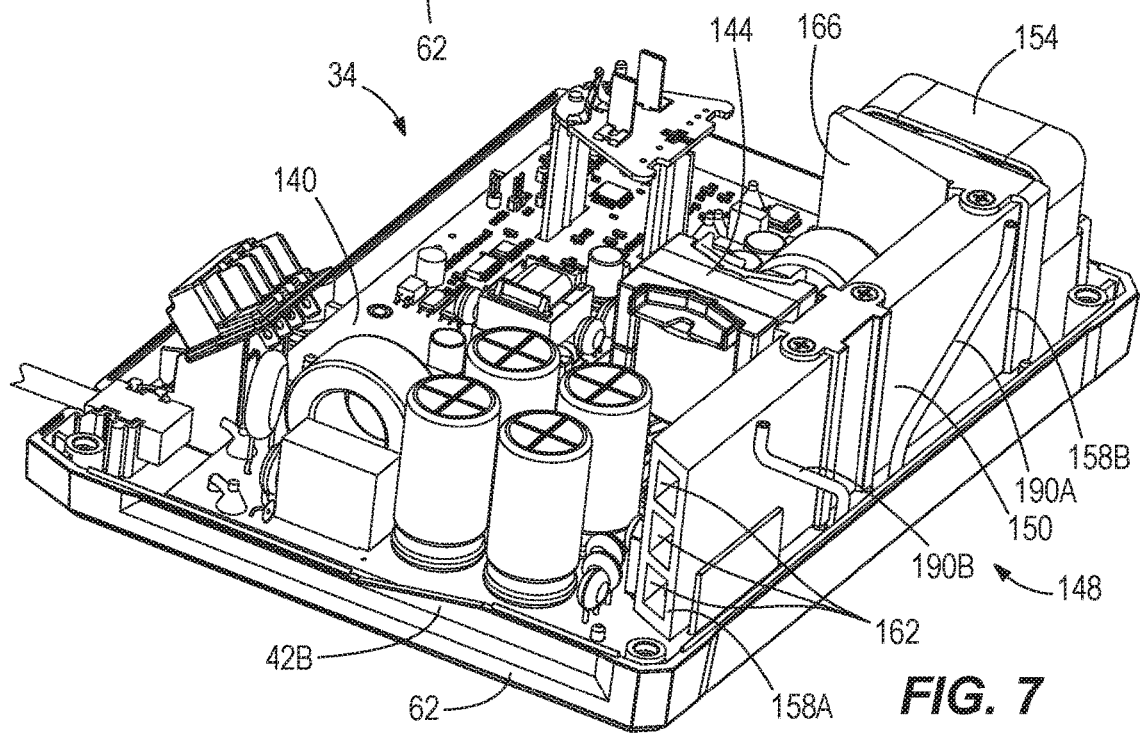
FIG. 7 is another top perspective view of the battery charger of FIG. 2, with portions of the housing removed.

With reference to FIGS. 6-7, the charger electronics 34 are supported by the bottom portion 42B. The charger electronics 34 are operable to output a charging current to one or both of the batteries 14A, 14B to charge the batteries 14A, 14B. The charger electronics 34 include, among other things, a circuit board 140, a transformer 144, and a charger microcontroller 810. The charger electronics 34 may include a charging circuit portion for each of the batteries 14A, 14B so that each battery 14A, 14B may be charged simultaneously and independently. The charging current provided to each batter) 14A, 14B may be the same or different.

The charger 10 further includes a heat sink 150 and a fan 154 within the housing 18 to provide the heat dissipating structure 38. A temperature sensor 830 is disposed in the housing 18 and positioned near the charger electronics 34 (e.g., near the component(s) generating the most heat (e.g., the CPU, the transformer 144, field effect transistors (FETs), etc.)) or the heat sink 150. In the illustrated embodiment, the temperature sensor 830 is positioned proximate a side of the heat sink 150. In some embodiments, the temperature sensor 830 is considered "proximate" or "near" another element (e.g., the heat sink 150) when the temperature sensor 830 is within a few centimeters of the element, including when it is in direct contact with the element. Because of the proximity, the temperature sensed by the temperature sensor 830 is substantially and/or quickly influenced by changes in temperature of the proximate or nearby element.

Figure 8A:
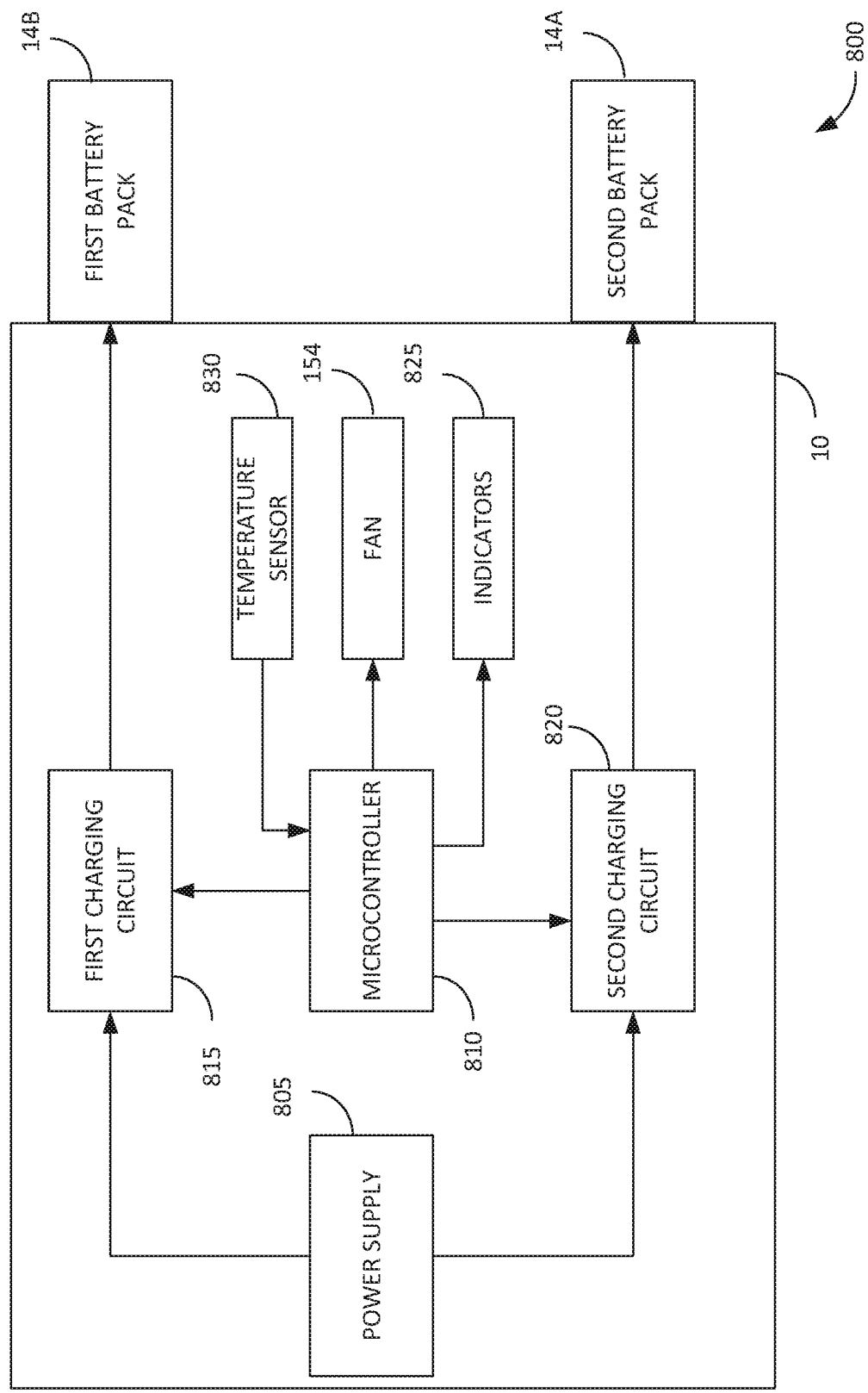
FIG. 8A is a schematic diagram illustrating electronics of the battery charger of FIG. 2.

Turning to FIG. 8A, a schematic diagram 800 illustrating electronics of the battery charger 10 are illustrated. In particular, the charger 10 includes a power supply 805, a microcontroller 810, a first charging circuit 815, a second charging circuit 820, indicators 825, a temperature sensor 830, and the fan 154. The power supply 805 includes, for example, the transformer 144 and other circuitry to rectify and condition AC power received (e.g., via an AC wall outlet) and provide DC power out to the other components of the battery charger 10 and, ultimately, to the first and second battery packs 14A, 14B for charging. The microcontroller 810 includes an electronic processor and a memory storing instructions that are executed by the electronic processor to implement the functions of the microcontroller 810 described herein. The microcontroller 810 controls the first charging circuit 815 and the second charging circuit 820 to charge the first battery pack 14A and the second battery pack 14B, respectively. For example, the first and second charging circuits 815, 820 each include controllable power switching elements (e.g., field effect transistors, IGBTs, and the like) that the microcontroller 810 selectively enables to provide power from the power supply 805 to the respective battery packs 14A, 14B. The microcontroller 810 further determines the temperature of the battery charger 10 based on an output signal from the temperature sensor 830 and drives the fan 154 according to the determined temperature, as described in further detail below (see, e.g., FIG. 8B and corresponding description). The indicators 825 are controlled by the microcontroller 810 to indicate to a user an operation of the battery charger 10, as described further below.

Returning to FIGS. 6-7, in the illustrated construction, the heat sink 150 is disposed in the housing 18 proximate the back 54. In other constructions (not shown), the heat sink 150 may be positioned at other locations in the housing 18 (e.g., proximate the front, the sides 56, 60, etc.). The heat sink 150 is in heat transfer relationship with components of the charger electronics 34 (e.g., is mounted onto and in contact with the circuit board 140). In other words, heat transfers from the heat-generating components of the charger 10 to the heat sink 150 through conduction.

Additionally, in the illustrated embodiment, the heat sink 150 is formed of heat-conducting material, such as, for example, aluminum, and extends between opposite ends 158A, 158B. Furthermore, the illustrated heat sink 150 is constructed of one or more hollow tubes 162 (three are shown in FIG. 7), each having a rectangular shape and stacked above one another. The tubes 162 extend between the opposite ends 158A, 158B. As such, the illustrated heat sink 150 forms a tubular heat sink.

In other constructions (not shown), the hollow tube(s) 162 may have another shape, such as, for example, triangular, cylindrical, etc., and the heat sink 150 may have any number of tubes 162 (e.g., one, two, more than three). The charger 10 may include more than one heat sink 150.

The first end 158A forms an inlet of each tube 162 for air flow to enter the heat sink 150, and the second end 158B forms an outlet of each tube 162 for air flow to exit the heat sink 150. As shown in FIG. 7, the inlet of each tube 162 is angled toward the side and the front of the housing 18.

Still further, in the illustrated embodiment, the heat sink 150 is formed by a first heat sink portion 150A and a second heat sink portion 150B. The first and second heat sink portions 150A. 150B are spaced apart from each other (FIG. 6). A connection member 149 connects an outlet end of the first heat sink portion 150 to an inlet end of the second heat sink portion 150B. As such, the connection member 149 is configured to fluidly connect the hollow tube(s) of the heat sink portions 150A, 150B. The connection member 149 may be formed of a heat sinking material, such as aluminum, but may also be formed by a non-heat sinking material, such as plastic. Additionally, the connection member 149 is connected to the first and second heat sink portions 150A, 150 by fasteners. Accordingly, the heat sink portions 150A. 150B and the connection member 149 may be termed as a heat sink assembly 148. In other constructions, the heat sink 150 may be formed by a single piece such that the connection member 149 is not necessary.

The illustrated fan 154 is positioned between the second end 158B of the heat sink 150 and the outlet 104. A baffle 166 extends between the second end 158B and the fan 154 for directing air flow from the heat sink 150 to the outlet 104. Projections 170A, 170B extend from the top portion 42A (FIG. 5) and the bottom portion 42B (FIG. 6). The fan 154 is positioned between (i.e., sandwiched between) the projections 170A, 170B to be secured within the housing 18.

The illustrated fan 154 is a multi-speed fan operable to rotate at more than one speed and directs air flow from the inlet 96 through the housing 18 and to the outlet 104. The speed at which the fan 154 rotates may be determined based on a temperature of one or more of the charger electronics 34, the heat sink 150, a supported battery 14A, 14B, etc. The temperature sensor 830 is configured to measure the temperature and transmit a signal output to the microcontroller for determining the temperature of the charger 10. Subsequently, the microcontroller controls the speed of the fan 154 based on the temperature (e.g., of the heat sink 150, as illustrated). In some embodiments, at full speed, the fan 154 generates an air flow of between 13.6 $m^3$/hour and 25.5 $m^3$/hour.

Figure 5:
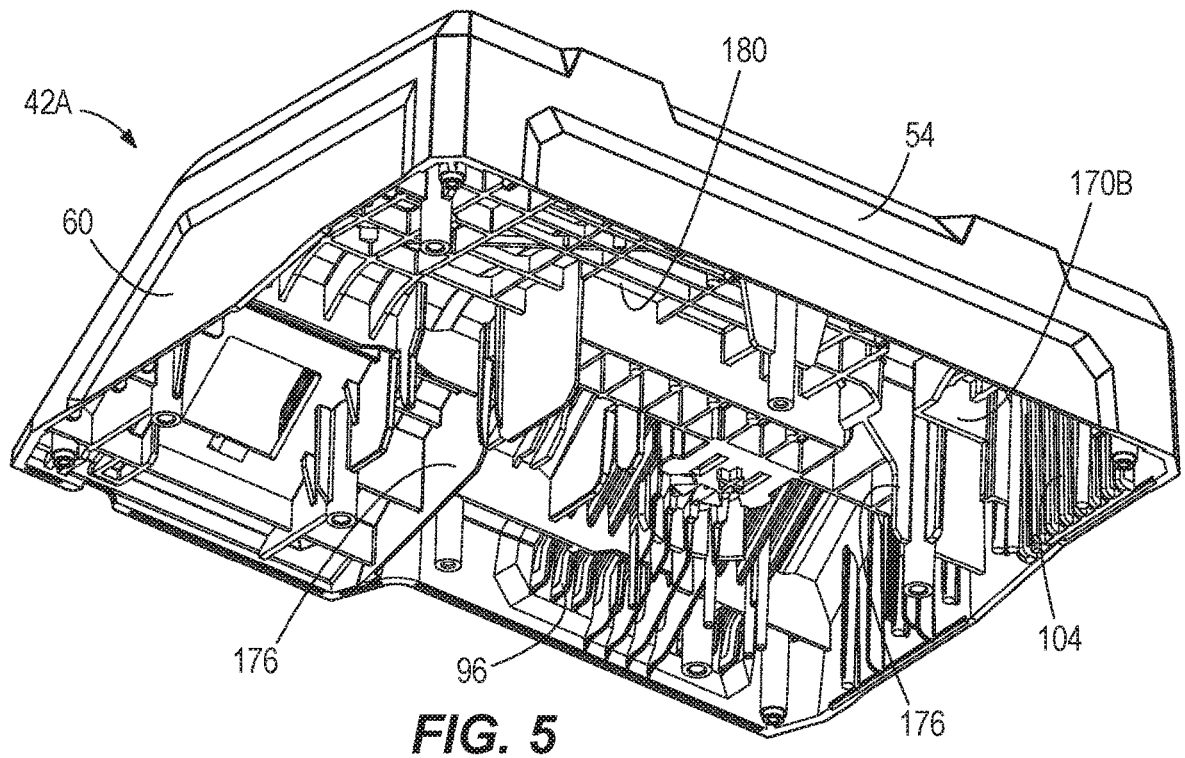
FIG. 5 is a bottom perspective view of an upper housing of the battery charger of FIG. 2.

With reference to FIG. 5, the top portion 42A of the housing 18 includes a plurality of wall members 176 extending from an inner surface 180. The wall members 176 are integral with the top portion 42A and are configured to form a fluid diverter within the housing 18. The diverter may direct air (FIG. 6) from the inlet 96 over the charger electronics 34 (e.g., the circuit board 140) to the heat sink 150. Furthermore, the diverter is configured to create turbulent fluid flow and may, therefore, increase air flow through the housing 18 and/or facilitate dissipation of heat from the housing 18. The bottom portion 42B may also include similar integral wall members or diverters for further directing air flow through the housing 18. The wall members 176 may further extend through the circuit board 140 for directing air flow through the circuit board 140 and through the housing 18.

As shown in FIG. 6, the charger 10 defines a flow path A (i.e., linear arrows) through the housing 18. In the illustrated embodiment, air flows along the flow path A from the inlet 96, over the charger electronics 34 (e.g., the circuit board 140) to the inlet of the heat sink 150, and through the heat sink 150 to the outlet 104. The fan 154 directs air flow along the flow path A. Furthermore, the fan 154 directs air flow into the inlet and out of the outlet of each tube 162. The air flow operates to dissipate heat generated by the charger electronics 34 from the housing 18. In some embodiments of the charger 10, the fan 154 may be operated in reverse such that the flow path A through the housing 18 is reversed, the inlet(s) become outlet(s), and the outlet(s) become inlet(s). See also, for example, FIG. 14, which illustrates a reversed airflow path.

In one example (see FIG. 9 in which the housing 18 and the heat sink 150 are shown as transparent to illustrate the air flow), air (e.g., curvilinear lines) flows from the inlet 96 to the outlet 104 through the housing 18. Specifically, air flows from the inlet 96, over the charger electronics 34, and through the heat sink 150 to the outlet 104. The inlet 96, the heat sink 150, and the outlet 104 are positioned to direct the air along this flow path for dissipating the heat generated by the charger 10.

The charger 10 may further define a second flow path in fluid communication with the second inlet 110. Specifically, air flows into the bottom of the housing 18 through the second inlet 110 and past components of the charger electronics 34 positioned on the bottom side 118 of the circuit board 140. The air flow in the second flow path may be combined with air flow in the first flow path from the first inlet 96 to exit the outlet 104. As such, air flow within the housing 18 may be separated along at least a portion of the flow paths through the housing 18. Additionally, as previously noted, in some embodiments of the charger 10, the fan 154 may be operated in reverse such that air flow paths illustrated in FIG. 9 are generally reversed, the inlet(s) become outlet(s), and the outlet(s) become inlet(s).

The circuit board 140 may further include a heat sink or copper (not shown) extending from a top side 184 through the circuit board 140 to the bottom side 118 to dissipate heat generated by any of the components of the charger electronics 34 to the bottom side 118. Air entering the housing 18 through the second inlet 110 is configured to flow past the bottom side 118 to further facilitate dissipation of heat of the charger electronics 34 from the housing 18.

The heat sink 150 may include a slot (not shown) proximate one or some of the components of the charger electronics 34, such as, for example, the transformer 144. The slot may be configured to direct a portion of air flowing through the heat sink 150 over a specific component (e.g., the transformer 144) on the circuit board 140. The slot may be positioned such that the air flow is directed back through a portion of the heat sink 150 after being directed over a specific component. As such, air may flow at least partially through the heat sink 150 more than once.

With reference to FIGS. 6-7, the charger 10 includes a plurality of light pipe assemblies 190 (e.g., two light pipe assemblies 190A, 190B), each extending to the opening 130A, 130B defined by the top portion 42A. In the illustrated embodiment, the light pipe assemblies 190A, 190B form the light source for each indicator. The light pipe assemblies 190A, 190B are in heat transfer relationship ((e.g., mounted onto and in contact) with the heat sink 150 for transferring heat generated by the light pipe assemblies 190A, 190B to the heat sink 150.

The light pipe assemblies 190A, 190B are connected to the charger electronics 34 for controlling illumination of the light pipes 190A, 190B. More specifically, one end of the respective light pipe 190A, 190B is optically connected to a respective light emitting diode (LED) positioned on the circuit board 140, and an opposite end of the respective light pipe 190A, 190B is positioned adjacent the respective lens 134 (FIG. 1) to illuminate the lens 134. The LEDs are controlled by the charger electronics 34. The illustrated light pipes of the respective light pipe assemblies 190A, 190B are formed by optical fibers. As such, the light pipe assemblies 190A, 190B are examples of the indicators 825 controlled by the microcontroller 810 (see, e.g., FIG. 8A). For example, the indicator of the first supporting section 64A (i.e., the light pipe assembly 190A) may be operated when the first battery 14A is electrically connected to the charger terminals 74 of the first supporting section 64A. As such, the indicators 825 may be configured to indicate to a user when the respective batteries 14A, 14B are connected and charging. In the illustrated embodiment, the indicator at least includes a light pipe of the respective light pipe assembly 190A, 190.

In operation, one or both of the batteries 14A. 14B are coupled to the respective battery support structure 22A. 22B (e.g., the supporting sections 64A, 64B) for charging. The first set of terminals 74 electrically connect with the battery terminals of the first battery 14A, and/or the second set of terminals 92 electrically connect with the battery terminals of the second battery 14B. The charger 10 supplies charging current to the first and/or second battery 14A, 14B. Each indicator 825 indicates to the user the charging operation for the associated battery 14A, 14B (e.g., completion of charging (i.e., when the charging current is zero Amps (0 A), when charging is in-process, when a charging error/fault occurs).

Figure 8B:
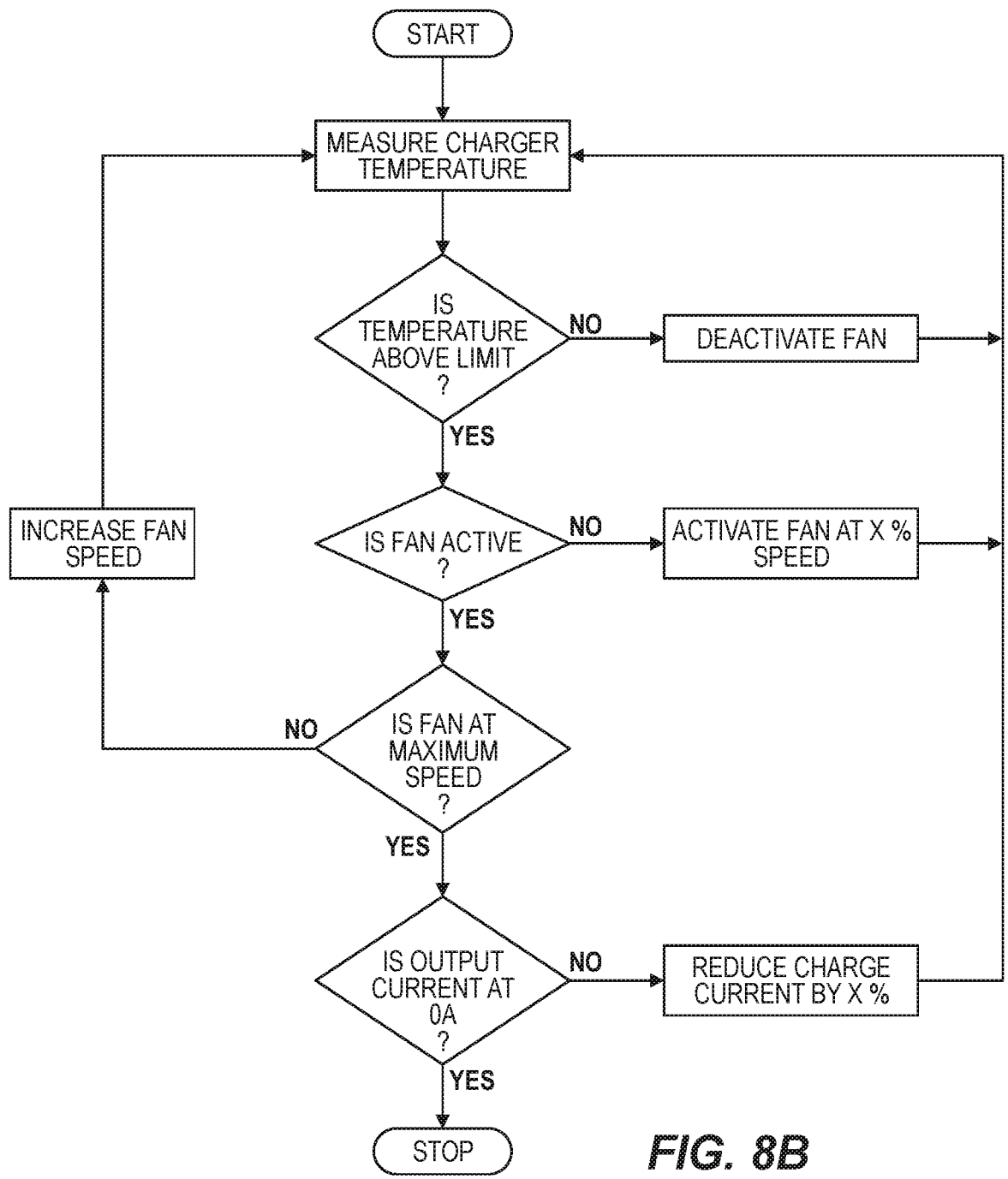
FIG. 8B is a flow chart illustrating a method of operating the battery charger of FIG. 2.

As mentioned above, in the illustrated construction, the fan 154 is a multi-speed fan. With reference to FIG. 8B, the microcontroller 810 determines the charger temperature (e.g., of the heat sink(s) 150, the charger electronics 34, etc.) using the temperature sensor 830 and, when the temperature reaches or exceeds a threshold, activates the fan 154 to operate at a corresponding fan speed. For example, when the microcontroller 810 detects a temperature above a first threshold, then the fan 154 is activated at a first speed or percentage of maximum speed (e.g., about 50% speed). It should be understood that, in other embodiments, the fan 154 may be activated at a different speed (e.g., more than 50% (100%, 75%, etc.) or less than 50% (25%, 10%, etc.)). Also, the speed of the fan 154 may be based on the sensed temperature (e.g., higher for a higher temperature or lower for a lower temperature) and/or a duration the sensed temperature exceeds a threshold (e.g., higher for a longer duration or lower for a shorter duration). For example, when the microcontroller 810 detects a temperature above a first threshold, then the fan 154 is activated at a first speed or percentage of maximum speed (e.g., about 50% speed), when the microcontroller 810 detects a temperature above a second (higher) threshold, then the fan 154 is activated at a second (higher) speed or percentage of maximum speed (e.g., about 75% speed), and so on until maximum fan speed is reached.

When the fan 154 is not at the maximum speed, then the microcontroller 810 may increase the speed of the fan 154 by X % (e.g., about an additional 10%), and the loop starts over (i.e., measuring the battery temperature and the charger temperature). It should be understood that, in other embodiments, the speed of the fan 154 may be increased by a different amount (e.g., 5%, 15%, 25%, etc.)). Also, the increase in the speed of the fan 154 may be based on the sensed temperature and/or duration the sensed temperature exceeds a threshold.

When the fan 154 is at the maximum speed, the microcontroller 810 may determine the charging current output of the charger 10. When the charging current output is not 0 A, then the microcontroller 810 may reduce the charge current by X % (e.g., about 10%), and the loop may start over (i.e. measuring the battery temperature and the charger temperature). It should be understood that, in other embodiments, the charge current may be reduced by a different amount (e.g., 5%, 15%, 25%, 50%, etc.)). Also, the reduction in the charge current may be based on the sensed temperature and/or duration the sensed temperature exceeds a threshold.

The microcontroller 810 determines the charger temperature and controls the speed of the fan 154 regardless of whether either of the batteries 14A, 14B is coupled to the charger 10. The microcontroller deactivates the fan 154 in response to determining that the sensed temperature is below a threshold (e.g., a lower limit of the charger 10), rather than, for example, determining that one or both of the batteries 14A, 14B are disconnected. Accordingly, the microcontroller 810 controls the fan 154 to cause air flow through the housing 42 and adjusts the fan speed of the fan 154 based on the temperature of the battery charger 10 (i) while one or both of the batteries 14A, 14B is coupled to the charger 10 for charging and (ii) while no batteries are coupled to the charger 10 for charging (i.e., when both batteries 14A, 14B are disconnected from the charger 10).

FIGS. 11-12B illustrate another alternative construction of a battery charger 210, with like components and features as the embodiment of the battery charger 10 shown in FIGS. 2-10B being labeled with like reference numbers plus "200." The battery charger 210 is similar to the charger 10 and, accordingly, the discussion of the battery charger 10 above similarly applies to the battery charger 210 and is not re-stated. Rather, only differences between the battery charger 10 and battery charger 210 are specifically noted herein, such as differences in the heat sink assembly. Additionally, the diagram 800 of FIG. 8A and the flow chart of FIG. 8B similarly apply to the battery charger 200.

The battery charger 210 includes a housing 218 having a top portion (not shown) and an opposite bottom portion 242B coupled to the top portion. The top portion, while not shown, is similar to the top portion 42A of the charger 10 (see FIG. 1). The battery charger 210 further includes charger electronics 234 and a heat dissipating structure 238. Air flow is configured to flow though the housing 218 for dissipating heat generated by the charger 210. In particular, air flow flows through the housing 218 from an air inlet 296 to an air outlet 304.

The charger electronics 234 are supported by the bottom portion 242B. The charger electronics 234 are operable to output a charging current to one or both of batteries (e.g., batteries 14A, 14B of the first embodiment of FIGS. 2-10B) connected to the battery charger 210 for charging of the batteries. The charger electronics 234 include, among other things, a circuit board 340, a transformer 344, and the charger microcontroller 810 (not labeled) on the circuit board 340.

The battery charger 210 further includes a heat sink assembly 348 and a fan 354 to provide the heat dissipating structure 238. The temperature sensor 830 (not labeled) may be disposed in the housing 218 and positioned near the charger electronics 234 (e.g., near the component(s) generating the most heat (e.g., the CPU, the transformer 344, field effect transistors (FETs), etc.)) or the heat sink assembly 348.

Similar to the first embodiment, the heat sink assembly 348 is disposed in the housing 218 proximate a back 254 of the housing 218. In other constructions (not shown), the heat sink assembly 348 may be positioned at other locations in the housing 218. The heat sink assembly 348 is in heat transfer relationship with components of the charger electronics 234. For example, the heat sink assembly 348 is mounted onto and in contact with the circuit board 340 and components on the circuit board (e.g., the microcontroller 810, the transformer 344. FETs, etc.) may be in direct physical contact with the heat sink assembly 348.

Figure 13A:
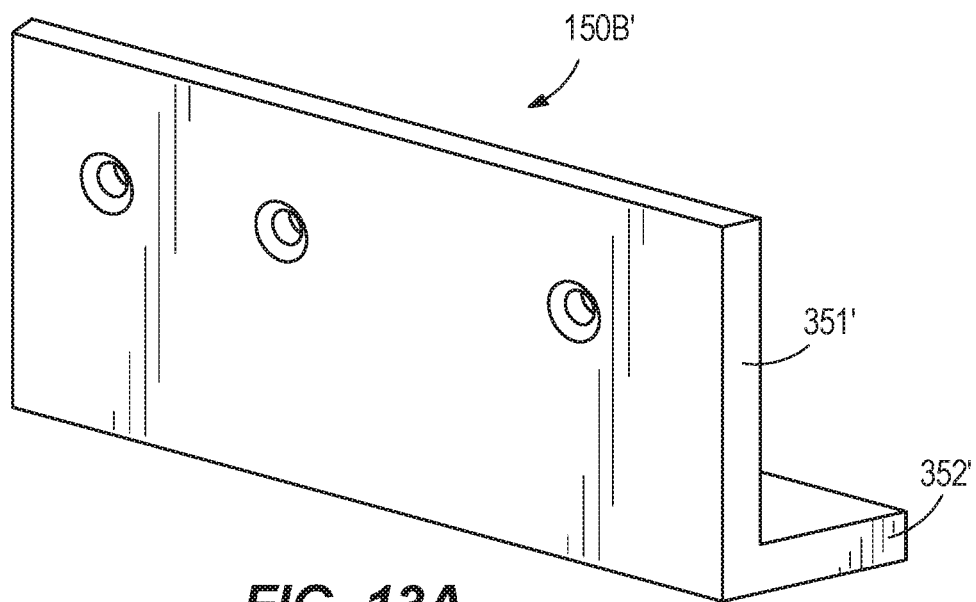
FIG. 13A is a perspective view of another embodiment of a heat sink of the heat sink assembly of FIG. 11.
Figure 13B:
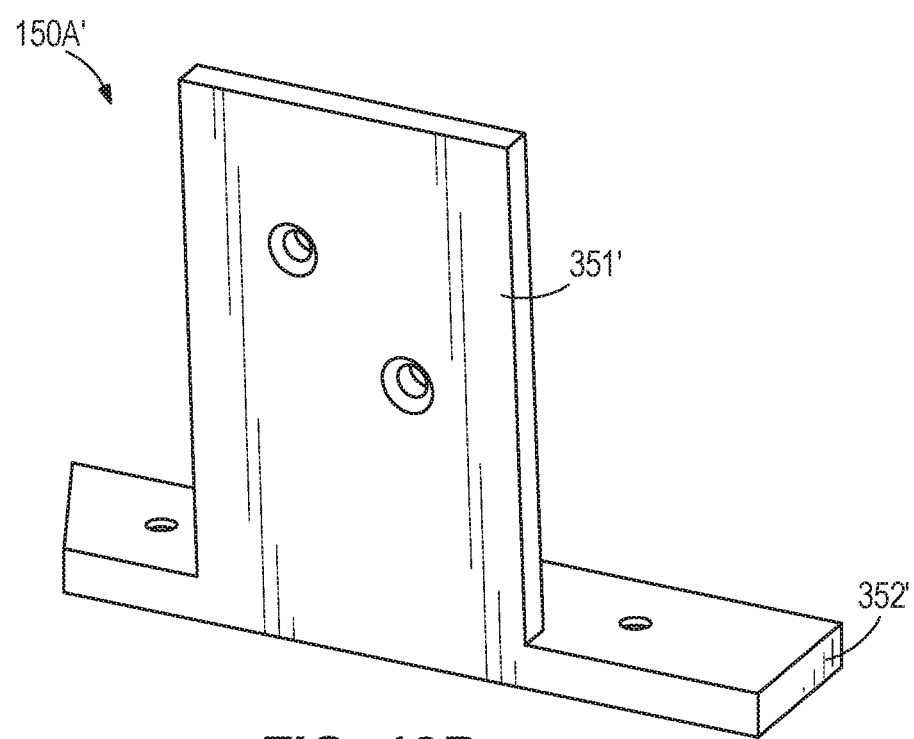
FIG. 13B is a perspective view of yet another embodiment of a heat sink of the heat sink assembly of FIG. 11.

The heat sink assembly 348 includes a first heat sink portion 350A and a second heat sink portion 350B spaced away from the first heat sink portion 350A (collectively, the heat sink 350). However, in this construction of the heat sink 350, each heat sink portion 350A, 350B includes a first section 351 and a second section 352 coupled to the first section 351. The second section 352 is perpendicular to the first section 351 such that each heat sink portion 350A, 350B has an "L" shaped cross-section (FIGS. 12A and 12B). In other constructions, the second section 352 may extend at an angle relative to the first section 351 (e.g., 80 degrees, 70 degrees, etc.). Further, a size (e.g., length, width, etc.) of the heat sink portions 350A, 350B, or the first and second sections 351, 352 themselves, may be the same or different. For example, as shown in FIGS. 12A and 12B, the first and second heat sink portions 350A, 350B are about the same size. In another example, as shown in FIGS. 13A and 13B, a first section 351' of a first heat sink portion 350A' has a length that is smaller than a length of a second section 352' of the first heat sink portion 350A' (see FIG. 13B), but first and second sections 351', 352, respectively, of a second heat sink portion 150B' have the same length (see FIG. 13A).

Each heat sink portion 350A, 350B is coupled to the circuit board 340. Specifically, the second section 352 is secured to a top surface of the circuit board 340. Further, the first heat sink portion 350A is positioned closer to the fan 354 than the second heat sink portion 350B.

The illustrated fan 354 is positioned between an end 358 of the heat sink 350 (i.e., the first heat sink portion 350A) and the inlet 296. Similar to the fan 154 of the first embodiment, the fan 354 is a multi-speed fan operable to rotate at more than one speed and directs air flow from the inlet 296 through the housing 218 and to the outlet 304. The fan 354 is controlled by the microcontroller 810 in a similar manner as the fan 154 (see, e.g., the flow chart of FIG. 8B). In some embodiments, at full speed, the fan 354 generates an air flow of between 13.6 m$^3$/hour and 25.5 m$^3$/hour. However, in this embodiment, a rotation of the fan 354 may be reversed such that the inlet 296 is positioned on a side 256 of the housing 218 and the outlet 304 is positioned on a front.

Figure 14:
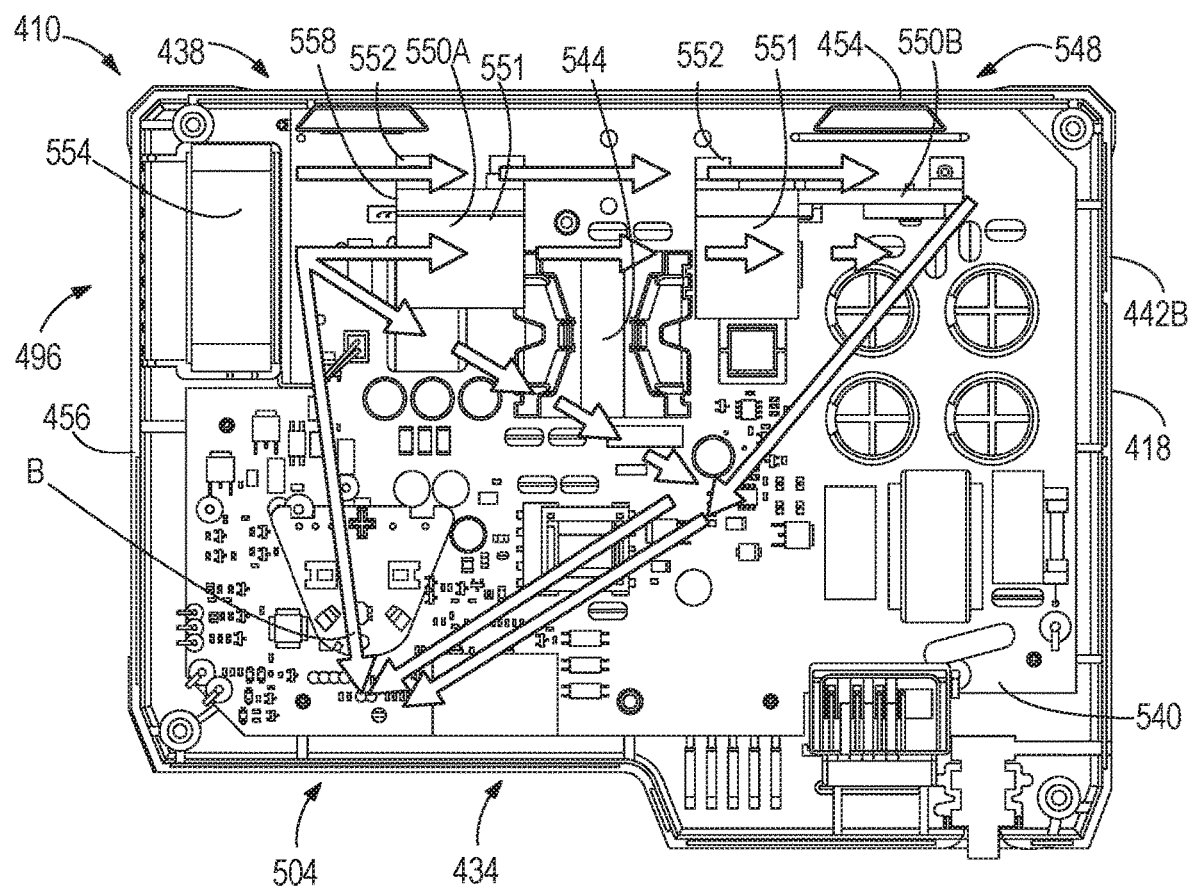
FIG. 14 is a top view of yet another alternative construction of a battery charger, with portions of a housing removed and illustrating an airflow pattern through the housing.
Figure 15:
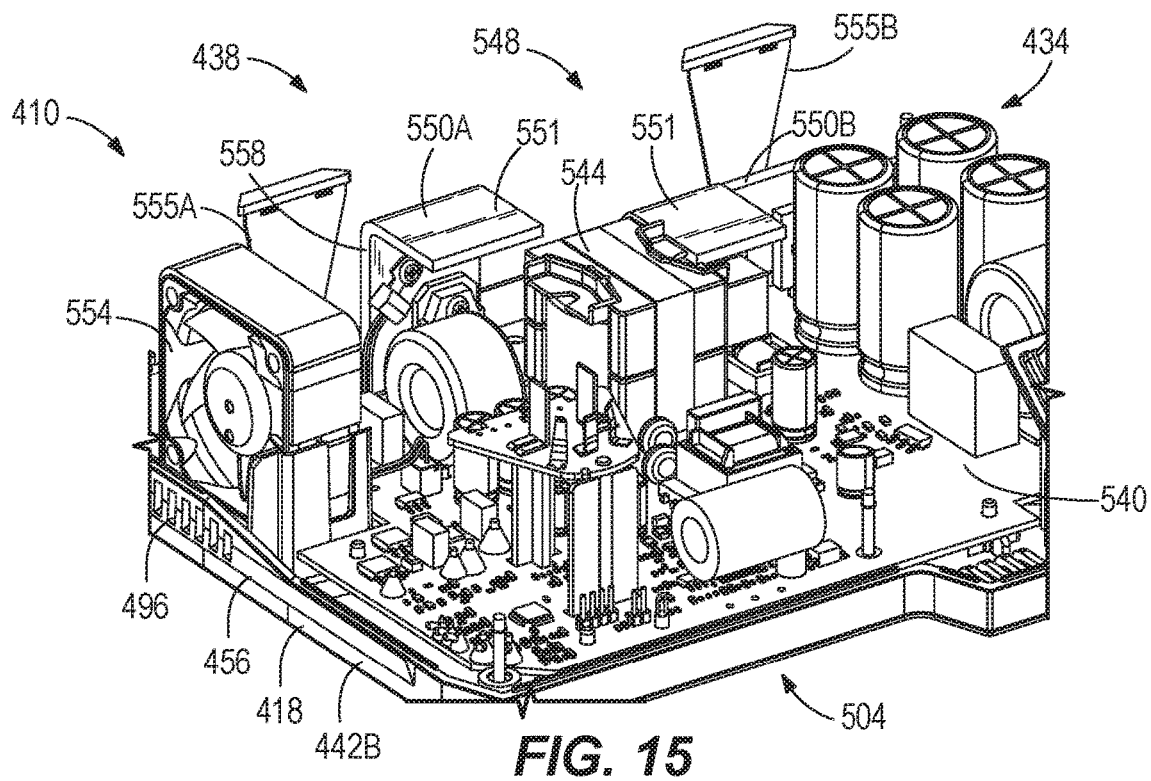
FIG. 15 is a top perspective view of a portion of the battery charger of FIG. 14, with portions of the housing removed and illustrating a third embodiment of a heat sink assembly.
Figure 16:
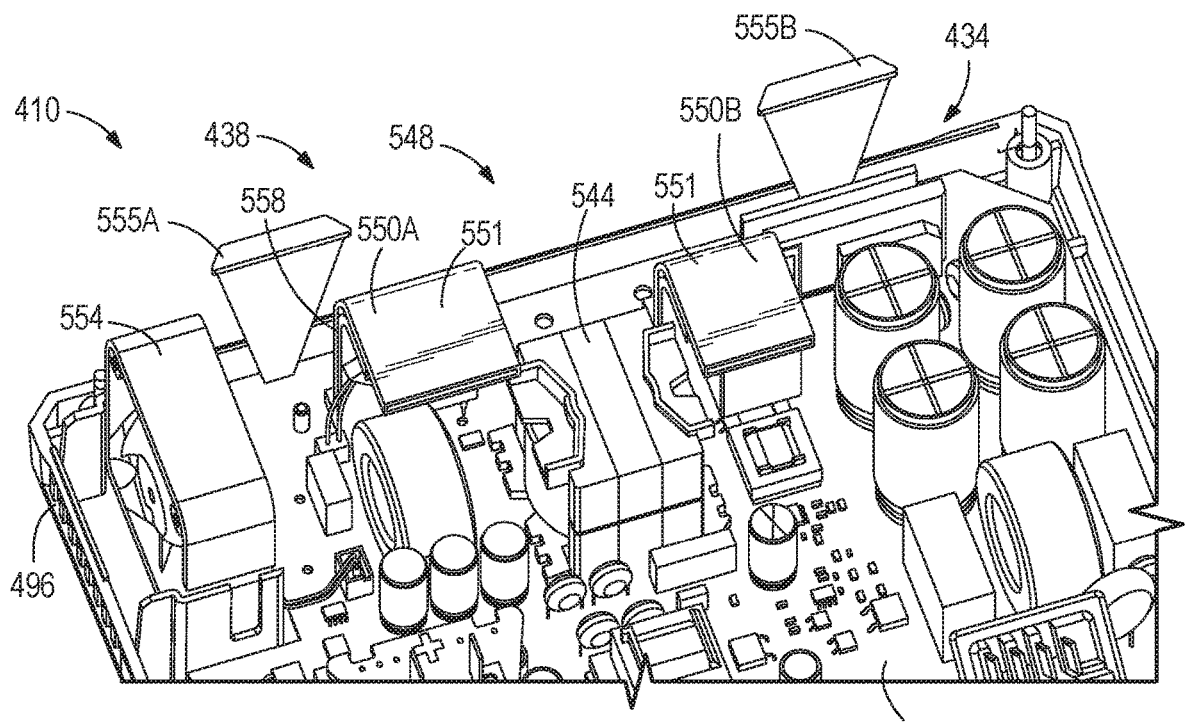
FIG. 16 is a top perspective view of another portion of the battery charger of FIG. 14, with portions of the housing removed.

FIGS. 14-16 illustrate yet another alternative construction of a battery charger 410, with like components and features as the embodiment of the battery charger 10 shown in FIGS. 2-10B being labeled with like reference numbers plus "400." The battery charger 410 is similar to the charger 10 and, accordingly, the discussion of the battery charger 10 above similarly applies to the battery charger 410 and is not re-stated. Rather, only differences between the battery charger 10 and battery charger 410 are specifically noted herein, such as differences in the heat sink assembly. Additionally, the diagram 800 of FIG. 8A and the flow chart of FIG. 8B similarly apply to the battery charger 400.

The battery charger 410 includes a housing 418 having a top portion (not shown) and an opposite bottom portion 442B coupled to the top portion. The top portion, while not shown, is similar to the top portion 42A of the charger 10 (see FIG. 1). The battery charger 410 further includes charger electronics 434 and a heat dissipating structure 438. Air flow is configured to flow though the housing 418 for dissipating heat generated by the charger 410. In particular, air flow flows through the housing 418 from an air inlet 496 to an air outlet 504.

The charger electronics 434 are supported by the bottom portion 442B. The charger electronics 434 are operable to output a charging current to one or both of batteries (e.g., batteries 14A, 14B of the first embodiment of FIGS. 2-10B) connected to the battery charger 410 for charging of the batteries. The charger electronics 434 include, among other things, a circuit board 540, a transformer 544, and the charger microcontroller 810 (not labeled) on the circuit board 540.

The battery charger 410 further includes a heat sink assembly 548 and a fan 554 to provide the heat dissipating structure 438. The temperature sensor 830 (not labeled) may be disposed in the housing 418 and positioned near the charger electronics 434 (e.g., near the component(s) generating the most heat (e.g., the CPU, the transformer 544, field effect transistors (FETs), etc.)) or the heat sink assembly 548.

Similar to the first and second embodiments (FIGS. 2-10B, and FIGS. 11-12B, respectively), the heat sink assembly 548 is disposed in the housing 418 proximate a back 454 of the housing 418. In other constructions (not shown), the heat sink assembly 548 may be positioned at other locations in the housing 418. The heat sink assembly 548 is in heat transfer relationship with components of the charger electronics 434. For example, the heat sink assembly 548 is mounted onto and in contact with the circuit board 540 and components on the circuit board 540 (e.g., the microcontroller 810, the transformer 544, FETs, etc.) may be in direct physical contact with the heat sink assembly 548.

Figure 17A:
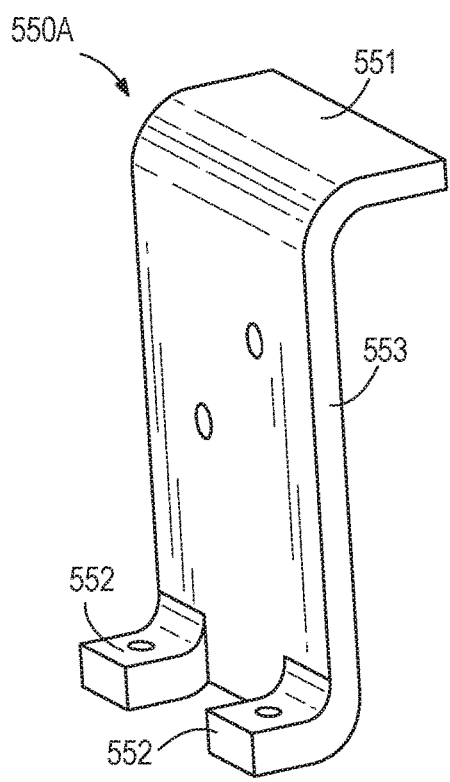
FIG. 17A is a perspective view of a first heat sink of the heat sink assembly of FIG. 15.
Figure 17B:
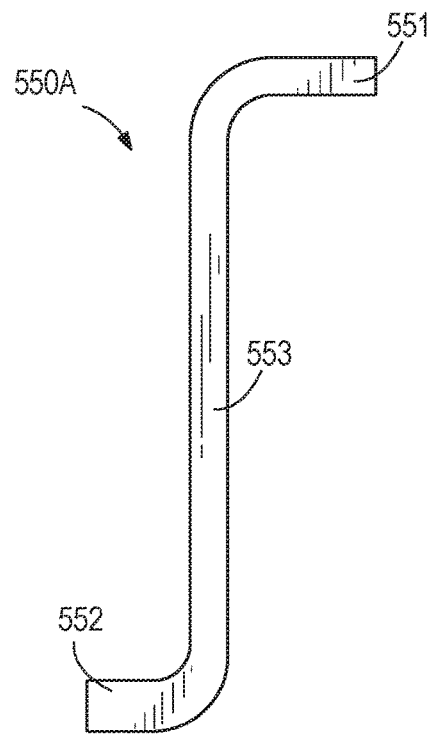
FIG. 17B is a side view of the first heat sink of FIG. 17A.
Figure 17C:
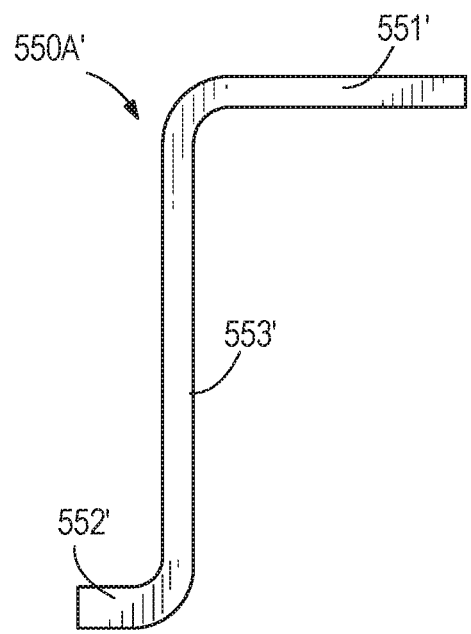
FIG. 17C is a side view of another embodiment of the first heat sink of FIG. 17A
Figure 18A:
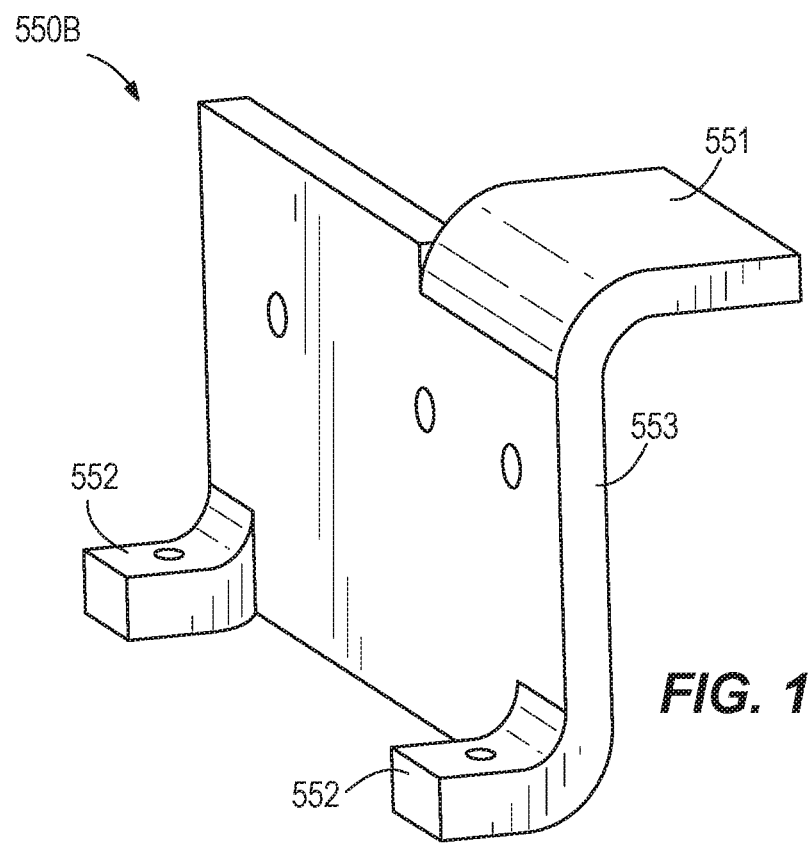
FIG. 18A is a perspective view of a second heat sink of the heat sink assembly of FIG. 15.
Figure 18B:
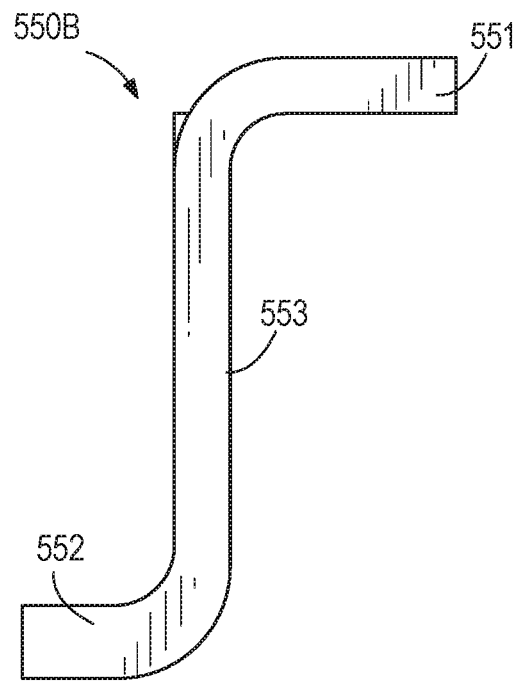
FIG. 18B is a side view of the second heat sink of FIG. 18A.
Figure 18C:
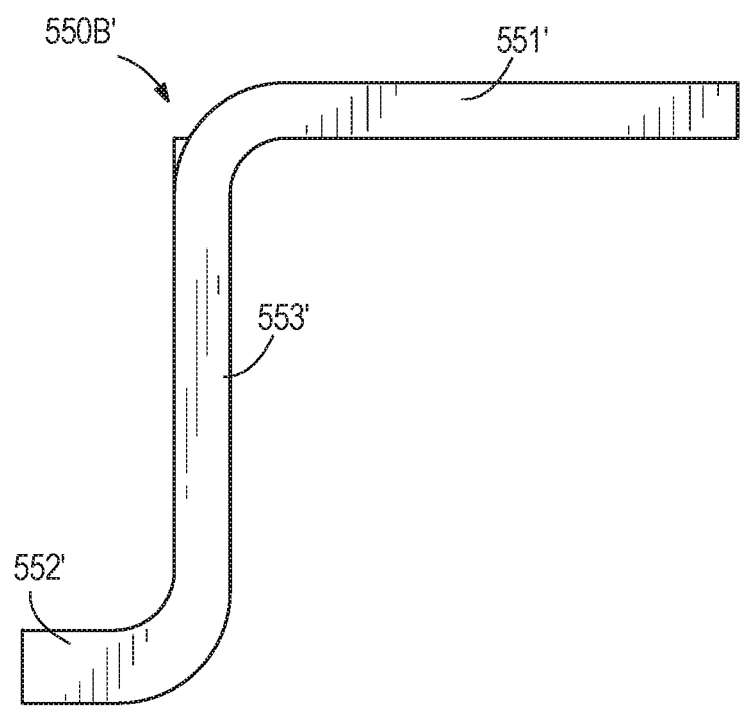
FIG. 18C is a side view of another embodiment of the second heat sink of FIG. 18A.

Further, similar to the heat sink assembly 348 of the second embodiment (FIGS. 11-12B), the heat sink assembly 548 includes a first heat sink portion 550A and a second heat sink portion 550B spaced away from the first heat sink portion 550A (collectively, the heat sink 550). However, in this construction of the heat sink assembly 548, each heat sink portion 550A, 550B includes a first section 551, a second section 552, and a third section 553 extending between the first and second sections 551, 552. In particular, each of the first and second sections 551, 552 are coupled a respective end of the third section 553 by a bend. Additionally, the first and second sections 551, 552 are substantially perpendicular to the third section 553 such that each heat sink portion 550A. 550B has an "S" shaped cross-section (FIGS. 17B and 18B, respectively). In other constructions, the first and second sections 551, 552 may extend at an angle relative to the third section 553 (e.g., 80 degrees, 70 degrees, etc.).

A size (e.g., length, width, etc.) of the heat sink portions 550A, 550B, or the first, second, and third sections 551, 552, 553 themselves, may be the same or different. For example, as shown in FIGS. 17A and 18A, the second section 552 is separated to form feet of the respective heat sink portion 550A, 550B. In another example, a length of the first heat sink portion 550A (FIG. 17A) is smaller than a length of the second heat sink portion 550B (FIG. 18A). In yet another example, as shown in FIGS. 17A and 18A, the first section 551 of the first heat sink portion 550A has a length that is larger than a length of the first section 551 of the second heat sink portion 550B. More specifically, the length of the first section 551 is about half of a total length of the first section 551 of the second heat sink portion 550B. Still further, in another example, a width of the sections 551, 552, 553 of the first or second heat sink portions 550A, 550B may vary. For example, as shown in FIGS. 17B-17C or FIGS. 18B-18C, the width of the first section 551 of the respective heat sink portion 550A, 550B is smaller than a width of a first section 551' of a respective heat sink portion 550A', 550B.

Each heat sink portion 550A. 550B is coupled to the circuit board 540. Specifically, the second section 552 is secured to a top surface of the circuit board 540. Further, the first heat sink portion 550A is positioned closer to the fan 554 than the second heat sink portion 550B.

The illustrated fan 554 is positioned between an end 558 of the heat sink 550 (i.e., the first heat sink portion 550A) and the inlet 496. Similar to the fan 154 of the first embodiment, the fan 554 is a multi-speed fan operable to rotate at more than one speed and directs air flow from the inlet 496 through the housing 418 and to the outlet 504. The fan 554 is controlled by the microcontroller 810 in a similar manner as the fan 154 (see. e.g., the flow chart of FIG. 8B). In some embodiments, at full speed, the fan 554 generates an air flow of between 13.6 m³/hour and 25.5 m³/hour. However, similar to the second embodiment, a rotation of the fan 554 may be reversed such that the inlet 496 is positioned on a side 456 of the housing 418 and the outlet 504 is positioned on a front.

With particular reference to FIG. 14, the fan 554 directs the air flow along the flow path B (i.e., linear arrows). Accordingly, a portion of the air flow entering the battery charger 410 is configured to flow from the air inlet 496 past the heat sink 550 and over the charger electronics 534, before exiting at the outlet 504, or may flow past only one of the heat sink portions 550A, 550, or not flow past any of the heat sink portions 550A, 550 before flowing over the charger electronics 534 to the outlet 504.

With reference to FIGS. 14-16, alternative constructions of light pipes are also illustrated. In particular, the charger 410 of FIGS. 14-16 includes a plurality of light pipe assemblies 555 (e.g., two light pipes 555A, 555B), each extending to the opening 130A, 130B defined by the top portion 42A (see FIG. 3). In the illustrated embodiment, the light pipes 555A, 555B form the light source for each indicator. Like the light pipe assemblies 190A. 190B, the light pipes 555A, 555B are connected to the charger electronics 434 for controlling illumination of the light pipes 555A, 555B. More specifically, one end of the respective light pipe 555A, 555B is optically connected to a respective light emitting diode (LED) positioned on the circuit board 540, and an opposite end of the respective light pipe 555A, 555B is positioned adjacent the respective lens 134 (FIG. 1) to illuminate the lens 134. The light pipes 555A, 555B have a wedge shape such that the end positioned near the circuit board 540 has a narrower width than the end positioned adjacent the respective lens 134. In some embodiments, the light pipes 555A. 555B are formed from a transparent or translucent, rigid plastic material. The LEDs are controlled by the charger electronics 34 similar to the light pipe assemblies 190A. 190B.

Although the battery chargers 210, 410 have only been described with respect to the construction of the respective heat sink assemblies 348, 548, the battery chargers 210, 410 may include other features as described with respect to the first embodiment of the battery charger 10, such as the diverter (wall members 176), and light pipes forming a light source for each indicator of the battery charger 210, 410.

Additionally, although the battery chargers described herein including battery chargers 10, 210, and 410, have generally been illustrated or described as having an airflow path in a particular direction, in some embodiments, the respective fans of these chargers is reversed relative to that which was described above and, accordingly, the resulting airflow paths through the respective charger housings is reversed, the inlet(s) become outlet(s), and the outlet(s) become inlet(s). Accordingly, each of the inlets and outlets of the various chargers described herein (e.g., inlets 96, 110, 296, 496, and outlets 104, 304, 504) may be referred to generally as an air port, and may be referred to as an inlet and outlet, depending on the fan rotation direction and resulting direction of airflow through the inlet (or outlet).

Accordingly, various embodiments of a battery charger 10, 210, 410 are described herein that are operable to charge different types of batteries 14A, 14B at the same time, and a method for dissipating heat regardless of whether the batteries 14A, 14B are coupled to the charger 10, 210, 410. The charger 10, 210, 410 may include structure (e.g., a diverter) integral with and positioned within the housing 18, 218, 418 and operable to direct air flow from the inlet 96, 296, 496 through the housing 18, 218, 418 to the outlet 104, 304, 504. The inlet 96, 296, 496 and the outlet 104, 304, 504 may be defined by adjacent sides (e.g., the front and the side) or on opposite sides (e.g., the front and the back).

Although the disclosure has been described in detail with reference to certain preferred embodiments, variations and modifications exist within the scope and spirit of one or more independent aspects of the disclosure as described. Various features and/or advantages of the disclosure are set forth in the following claims.

What is claimed is:
1. A battery charger comprising:
 a housing having support structure for simultaneously supporting at least two batteries of different types for charging including a first battery of a first type and a second battery of a second type, the support structure supporting charger terminals configured to electrically connect to battery terminals of the first battery and defining a channel configured to receive a projection of the first battery, at least a portion of the support structure including,
a plastic material molded to define the channel, and
a metal reinforcement molded in the plastic material;
charger electronics supported by the housing and operable to output charging current to charge the first battery and charging current to charge the second battery;
a fan operable to cause air flow through the housing, a fan speed of the fan adjustable based on a temperature of the battery charger (i) while at least one of the at least two batteries is coupled to the battery charger for charging and (ii) while no batteries are coupled to the battery charger for charging; and
an indicator positioned on the housing and operable to indicate an operation of the battery charger, the indicator including a light pipe for illuminating the indicator.

2. The battery charger of claim 1, further comprising a heat sink in heat transfer relationship with the charger electronics, the heat sink including a plurality of tubes such that the heat sink is a tubular heat sink, wherein the air flow is directed by the fan through at least a portion of the plurality of tubes.

3. The battery charger of claim 1, further comprising an air inlet and an air outlet defined by the housing, wherein the air flow is directed by the fan from the air inlet through the housing to the air outlet.

4. The battery charger of claim 1, wherein the charger electronics includes a microcontroller, the battery charger further including a temperature sensor electrically connected to the microcontroller and positioned to sense a temperature of the battery charger, wherein the temperature sensor generates a signal output to the microcontroller indicative of the temperature of the battery charger, and wherein the microcontroller controls the operation of the fan based on determining that the temperature exceeds a temperature threshold.

5. The battery charger of claim 1, wherein the support structure includes a first rail member and a second rail member spaced from the first rail member, the first rail member and the second rail member extending from the housing, the first rail member including the channel, the channel being defined as a first channel, the second rail member including a second channel operable to receive another projection on the first battery.

6. The battery charger of claim 5, wherein the second channel includes
a second plastic material molded to define the second channel, and
a second metal material molded in the second plastic material,
wherein the metal material defines a first C-shaped portion around the first channel and the second metal material defines a second C-shaped portion around the second channel.

7. The battery charger of claim 1, wherein the light pipe is connected to the charger electronics such that the charger electronics control illumination of the light pipe, and wherein the light pipe indicates to a user a charging operation of one of the supported batteries.

8. A battery charger comprising:
a housing having support structure for simultaneously supporting at least two batteries of different types for charging including a first battery of a first type and a second battery of a second type;
charger electronics supported by the housing and operable to output charging current to charge the first battery and charging current to charge the second battery;
a fan operable to cause air flow through the housing, a fan speed of the fan adjustable based on a temperature of the battery charger (i) while at least one of the at least two batteries is coupled to the battery charger for charging and (ii) while no batteries are coupled to the battery charger for charging;
an air inlet and an air outlet defined by the housing, wherein the air flow is directed by the fan from the air inlet through the housing to the air outlet;
a heat sink in heat transfer relationship with the charger electronics, wherein the fan is positioned between an end of the heat sink and at least one selected from the group of the air inlet and the air outlet; and
an indicator positioned on the housing and operable to indicate an operation of the battery charger, the indicator including a light pipe for illuminating the indicator.

9. The battery charger of claim 8, wherein the heat sink includes a plurality of tubes such that the heat sink is a tubular heat sink, and wherein the air flow is directed by the fan through at least a portion of the plurality of tubes.

10. The battery charger of claim 8, wherein the charger electronics includes a microcontroller, the battery charger further including a temperature sensor electrically connected to the microcontroller and positioned to sense a temperature of the battery charger, wherein the temperature sensor generates a signal output to the microcontroller indicative of the temperature of the battery charger, and wherein the microcontroller controls the operation of the fan based on determining that the temperature exceeds a temperature threshold.

11. The battery charger of claim 8, wherein the light pipe is connected to the charger electronics such that the charger electronics control illumination of the light pipe, and wherein the light pipe is configured to indicate to a user a charging operation of the first battery.

12. The battery charger of claim 11, wherein the indicator is a first indicator and the battery charger further comprising a second indicator having a second light pipe connected to the charger electronics and configured to indicate to the user a charger operation of the second battery.

13. A battery charger comprising:
a housing having support structure for simultaneously supporting at least two batteries of different types for charging including a first battery of a first type and a second battery of a second type;
charger electronics supported by the housing and operable to output charging current to charge the first battery and charging current to charge the second battery;
a fan operable to cause air flow through the housing that dissipates heat, a fan speed of the fan adjustable based on a temperature of the battery charger (i) while at least one of the at least two batteries is coupled to the battery charger for charging and (ii) while no batteries are coupled to the battery charger for charging;
an air inlet and an air outlet defined by the housing, wherein the air flow is directed by the fan from the air inlet through the housing to the air outlet; and
a heat sink in heat transfer relationship with the charger electronics, wherein the fan is positioned between an end of the heat sink and at least one selected from the group of the air inlet and the air outlet.

14. The battery charger of claim 13, wherein the heat sink including a plurality of tubes such that the heat sink is a tubular heat sink, and wherein the air flow is directed by the fan through at least a portion of the plurality of tubes.

15. The battery charger of claim 13, wherein heat sink having at least one selected from the group of an L-shape cross-section and an S-shape cross section.

16. The battery charger of claim 13, wherein the charger electronics includes a microcontroller, the battery charger further including a temperature sensor electrically connected to the microcontroller and positioned to sense a temperature of the battery charger, wherein the temperature sensor generates a signal output to the microcontroller indicative of the temperature of the battery charger, and wherein the microcontroller activates the fan based on determining that the temperature exceeds a temperature threshold.

17. The battery charger of claim 16, wherein the temperature sensor is positioned proximate at least one selected from the group of the heat sink and the charger electronics.

18. A battery charger comprising:
a housing having support structure for simultaneously supporting at least two batteries of different types for charging including a first battery of a first type and a second battery of a second type, the support structure supporting charger terminals configured to electrically connect to battery terminals of the first battery and defining a channel configured to receive a projection of the first battery, at least a portion of the support structure including,
a plastic material molded to define the channel, and
a metal reinforcement molded in the plastic material; and
charger electronics supported by the housing and operable to output charging current to charge the first battery and charging current to charge the second battery.

19. The battery charger of claim 18, further comprising a heat sink in heat transfer relationship with the charger electronics, the heat sink including a plurality of tubes such that the heat sink is a tubular heat sink, wherein the air flow is directed by the fan through at least a portion of the plurality of tubes.

20. The battery charger of claim 18, further comprising:
an air inlet and an air outlet defined by the housing,
a fan operable to cause air flow through the housing from the air inlet through the housing to the air outlet (i) while at least one of the at least two batteries is coupled to the battery charger for charging and (ii) while no batteries are coupled to the battery charger for charging.

21. The battery charger of claim 18, wherein the support structure includes a first rail member and a second rail member spaced from the first rail member, the first rail member and the second rail member extending from the housing, the first rail member including the channel, the channel being defined as a first channel, the second rail member including a second channel operable to receive another projection on the first battery.

22. The battery charger of claim 21, wherein the second channel includes
a second plastic material molded to define the second channel, and
a second metal material molded in the second plastic material,
wherein the metal material defines a first C-shaped portion around the first channel and the second metal material defines a second C-shaped portion around the second channel.

23. The battery charger of claim 18, further comprising an indicator positioned on the housing and operable to indicate an operation of the battery charger, the indicator including a light pipe configured to indicate to a user a charging operation of one of the supported batteries.

* * * * *